US012777696B2

(12) United States Patent
Chen et al.

(10) Patent No.: US 12,777,696 B2
(45) Date of Patent: Oct. 27, 2026

(54) SEMICONDUCTOR DEVICE WITH AIR GAP AND METHOD FOR MANUFACTURING THE SAME

(71) Applicant: TAIWAN SEMICONDUCTOR MANUFACTURING COMPANY, LTD., Hsinchu (TW)

(72) Inventors: Hong-Chih Chen, Hsinchu (TW); Fu-Hsiang Su, Hsinchu (TW); Shih-Hsun Chang, Hsinchu (TW); Chia-Hao Kuo, Hsinchu (TW); Chih-Ting Yeh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 535 days.

(21) Appl. No.: 18/363,394

(22) Filed: Aug. 1, 2023

(65) Prior Publication Data

US 2025/0048704 A1 Feb. 6, 2025

(51) Int. Cl.

| | |
|---|---|
| ***H10D 64/01*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 84/01*** | (2026.01) |

(Continued)

(52) U.S. Cl.

CPC ......... *H10D 64/017* (2025.01); *H10D 30/014* (2025.01); *H10D 30/43* (2025.01); *H10D 30/6735* (2025.01); *H10D 30/6757* (2025.01); *H10D 62/115* (2025.01); *H10D 62/121* (2025.01); *H10D 84/0167* (2025.01); *H10D 84/0186* (2025.01); *H10D 84/0188* (2025.01); *H10D 84/038* (2025.01); *H10D 84/85* (2025.01)

(58) Field of Classification Search

CPC ............... H10D 64/017; H10D 30/014; H10D 84/0186; H10D 84/85; H10D 30/6757; H10D 62/121; H10D 84/0167; H10D 30/6735; H10D 30/43; H10D 84/038; H10D 62/115; H10D 84/0188

See application file for complete search history.

(56) References Cited

U.S. PATENT DOCUMENTS

2015/0091127 A1* 4/2015 Lee ........................ H10B 12/50 257/506

2021/0098309 A1* 4/2021 Min ..................... H10D 84/834

(Continued)

*Primary Examiner* — Richard A Booth

(74) *Attorney, Agent, or Firm* — Birch, Stewart, Kolasch & Birch, LLP

(57) ABSTRACT

A semiconductor device includes a semiconductor substrate, a plurality of metal portions, a plurality of nanosheet structures, and a plurality of isolation structures. The metal portions are disposed on the semiconductor substrate and are spaced apart from each other. The nanosheet structures are surrounded by the metal portions such that the nanosheet structures are spaced apart from each other. The isolation structures are disposed on the semiconductor substrate such that two adjacent ones of the metal portions are isolated from each other by a corresponding one of the isolation structures. Each of the isolation structures includes a first dielectric layer and an air gap surrounded by the first dielectric layer.

20 Claims, 16 Drawing Sheets

(51) Int. Cl.
*H10D 84/03* (2025.01)
*H10D 84/85* (2025.01)

(56) References Cited

U.S. PATENT DOCUMENTS

| | | | | |
|---|---|---|---|---|
| 2022/0262915 | A1* | 8/2022 | Su | H10D 30/031 |
| 2023/0049938 | A1* | 2/2023 | Peng | H10D 84/83 |

* cited by examiner

SEMICONDUCTOR DEVICE WITH AIR GAP AND METHOD FOR MANUFACTURING THE SAME

BACKGROUND

In recent years, there is an increase in application needs for semiconductor integrated circuit (IC) chips. In order to meet application needs, an increased device functional density (i.e., the number of electrical devices per chip area) in a semiconductor IC chip is desired. For example, in a semiconductor IC chip, a metal gate structure is being cut to obtain a plurality of metal gate portions, and each of the metal gate portions can be used in an individual electrical device (e.g., transistor). At present, the semiconductor industry strives to improve electrical characteristics of the semiconductor IC chip by, for example, lowering chip capacitance for reducing resistance-capacitance (RC) time delay. Nevertheless, improvement of the electrical characteristics of the semiconductor IC chip may be hindered by the current chip structure and material thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
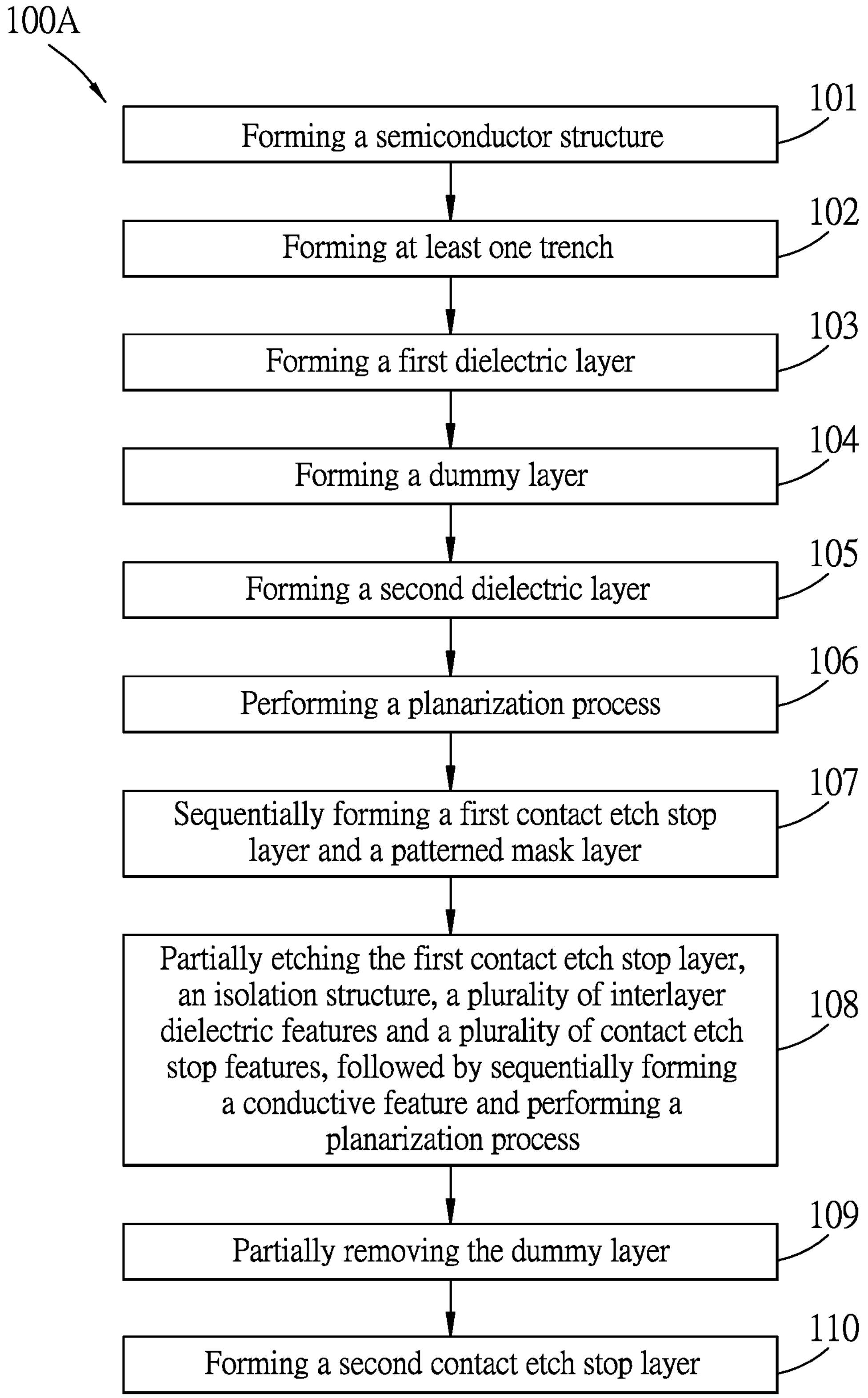
FIG. 1 is a flow diagram illustrating a method for manufacturing a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "upper," "lower," "innermost," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be noted that the element(s) or feature(s) are exaggeratedly shown in the figures for the purposed of convenient illustration and are not in scale.

For the purposes of this specification and appended claims, unless otherwise indicated, all numbers expressing amounts, sizes, dimensions, proportions, shapes, formulations, parameters, percentages, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some aspects ±10%, in some aspects ±5%, in some aspects ±2.5%, in some aspects ±1%, in some aspects ±0.5%, and in some aspects ±0.1% from the specified amount, as such variations are appropriate to perform the disclosed methods or employ the disclosed compositions.

Nowadays, semiconductor devices (e.g., fin field-effect transistors (FETs), get-all-around FETs, nanosheet FETs, forksheet FETs, or complementary FETs (CFETs)) are being applied in various fields, such as consumer electrical products. In order to meet various application needs, improvement of device performance (e.g., faster operating speed or better power efficiency) of the semiconductor devices is required. However, improvement of the device performance of the semiconductor devices faces some challenges. For example, there is a restriction on reduction of a parasitic capacitance of a capacitor structure formed between a metal gate endcap portion (i.e., a portion of a metal gate structure defined between a plurality of channel features and an isolation portion that is disposed in the metal gate structure) and a conductive feature (i.e., metal deposition (MD)) in a semiconductor device. In this case, a resistance-capacitance (RC) time delay of the semiconductor device may be difficult to be mitigated, and improvement of device performance of the semiconductor device may be restricted. Therefore, in order to improve the device performance of the semiconductor device, these challenges need to be overcome.

The present disclosure is directed to a semiconductor device and a method for manufacturing the same. FIG. 1 is a flow diagram illustrating a method 100A for manufacturing a semiconductor device 200A shown in FIGS. 11A to 11C in accordance with some embodiments. FIGS. 2 to 10C illustrate schematic views of some intermediate stages of the method 100A. Some portions may be omitted in FIGS. 2 to 10C for the sake of brevity. Additional steps can be provided before, after or during the method 100A, and some of the steps described herein may be replaced by other steps or be eliminated.

Figure 2:
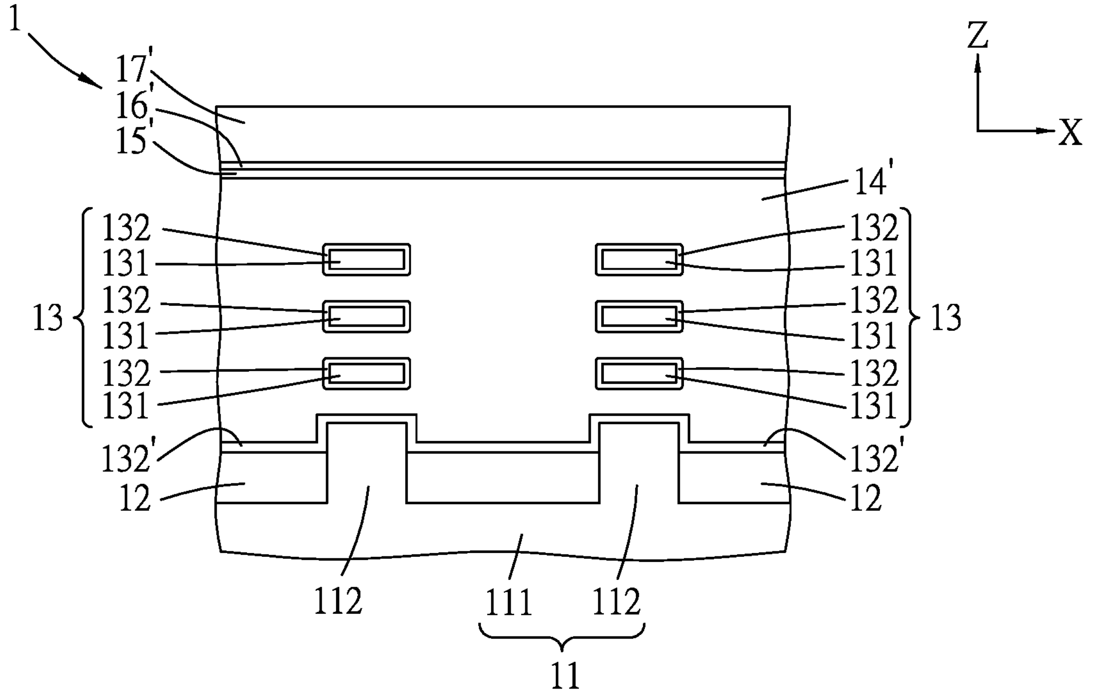
FIGS. 2 to 11C are schematic views illustrating some intermediate stages of the method as depicted in FIG. 1 in accordance with some embodiments.

Referring to FIG. 1 and the example illustrated in FIG. 2, the method 100A begins at step 101, where a semiconductor structure 1 is formed. The semiconductor structure 1 includes a semiconductor substrate 11, a plurality of isolation portions 12, a plurality of nanosheet structures 13, a high-dielectric constant (k) material layer 132', a metal layer 14', a first mask layer 15', a stop layer 16', and a second mask layer 17'.

The semiconductor substrate 11 may include, but are not limited to, an elemental semiconductor or a compound semiconductor. The elemental semiconductor includes a single species of atoms, such as silicon (Si) or germanium (Ge) from column XIV of the periodic table, and may be crystalline, polycrystalline, or amorphous in structure. Other suitable materials for the elemental semiconductor are within the contemplated scope of the present disclosure. The compound semiconductor includes two or more elements, and examples thereof may include, but are not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials for the compound semiconductor are within the contemplated scope of the present disclosure. The compound semiconductor may have a gradient feature in which the compositional ratio thereof changes from one location to another location in the compound semiconductor. The compound semiconductor may be formed over a silicon substrate and may be strained. In some embodiments, the semiconductor substrate 11 may include a multilayer compound semiconductor structure. In some embodiments, the semiconductor substrate 11 may include a lower portion 111 and a plurality of upper portions 112 that are disposed on the lower portion 111 in a Z direction and that are spaced apart from each other in an X direction transverse to the Z direction. The upper portions 112 may be also referred to as fins.

The isolation portions 12 are disposed on the lower portion 111 of the semiconductor substrate 11, and two adjacent ones of the isolation portions 12 are respectively located at two opposite sides (e.g., opposite to each other in the X direction) of a corresponding one of the upper portions 112 of the semiconductor substrate 11. The isolation portions 12 may be made of an oxide-based material (e.g., silicon oxide), a nitride-based material (e.g., silicon nitride), or a combination thereof. Other suitable materials for the isolation portions 12 are within the contemplated scope of the present disclosure. In some embodiments, each of the isolation portions 12 may be a portion of a shallow trench isolation (STI), a deep trench isolation (DTI), or other suitable structures.

The nanosheet structures 13 are located above the upper portions 112 of the semiconductor substrate 11, respectively. Each of the nanosheet structures 13 includes a plurality of channel features 131 and a plurality of high-k material features 132, where each of the channel features 131 is fully covered by a corresponding one of the high-k material features 132. The channel features 131 may include, for example, but not limited to, silicon (Si). The high-k material features 132 may include, for example, but not limited to, hafnium oxide, silicon nitride, silicon oxynitride, titanium oxide, hafnium zirconium oxide, tantalum oxide, hafnium silicon oxide, zirconium oxide, zirconium silicon oxide, lanthanum oxide, aluminum oxide, yttrium oxide, strontium titanate, barium titanate, barium zirconate, lanthanum silicon oxide, aluminum silicon oxide, hafnium lanthanum oxide, hafnium silicon oxide, aluminum silicon oxide, hafnium tantalum oxide, hafnium titanium oxide, other suitable high-k materials, or combinations thereof. Other suitable materials for each of the channel features 131 and the high-k material features 132 are within the contemplated scope of the present disclosure. In some embodiments, each of the nanosheet structures 13 may further include a plurality of interfacial features (not shown), each of which is disposed between a corresponding one of the channel features 131 and a corresponding one of the high-k material features 132. The interfacial features may include, for example, but not limited to, silicon oxide. Other suitable materials for the interfacial features are within the contemplated scope of the present disclosure.

The high-k material layer 132' is disposed on the upper portions 112 of the semiconductor substrate 11 and the isolation portions 12. The material for the high-k material layer 132' may be the same as or similar to that for the high-k material features 132, and thus details thereof are omitted for the sake of brevity. In some embodiments, the high-k material layer 132' and the high-k material features 132 may be formed simultaneously.

The metal layer 14' is disposed on the high-k material layer 132' and covers the nanosheet structures 13. The metal layer 14' may include, for example, but not limited to, a work-function metallic material, such as an n-type metal, an n-type metal compound, a p-type metal, or a p-type metal compound. In some embodiments, the n-type metal may include, for example, but not limited to, titanium (Ti), aluminum (Al), silver (Ag), manganese (Mn) and zirconium (Zr), or other suitable n-type metals. In some embodiments, the n-type metal compound may include, for example, but not limited to, tantalum carbide (TaC), tantalum carbide nitride (TaCN), tantalum silicon nitride (TaSiN), titanium silicon nitride (TiSiN), other suitable n-type metal compounds, or combinations thereof. In some embodiments, the p-type metal may include, for example, but not limited to, ruthenium (Ru), molybdenum (Mo), tungsten (W), platinum (Pt), or other suitable p-type metals. In some embodiments, the p-type metal compound may include, for example, but not limited to, titanium nitride (TiN), tantalum nitride (TaN), tungsten nitride (WN), zirconium disilicide ($ZrSi_2$), molybdenum disilicide ($MoSi_2$), tantalum disilicide ($TaSi_2$), nickel disilicide ($NiSi_2$), other suitable p-type metal compounds, or combinations thereof. Other suitable materials for the metal layer 14' are within the contemplated scope of the present disclosure.

The first mask layer 15' is disposed on the metal layer 14' opposite to the semiconductor substrate 11. The first mask layer 15' may be made of a nitride-based material. Other suitable materials for the first mask layer 15' are within the contemplated scope of the present disclosure.

The stop layer 16' is disposed on the first mask layer 15' opposite to the metal layer 14', and may serve as, for example, but not limited to, a planarization stop layer. The stop layer 16' may be made of silicon (Si). Other suitable materials for the stop layer 16' are within the contemplated scope of the present disclosure.

The second mask layer 17' is disposed on the stop layer 16' opposite to the first mask layer 15'. The second mask layer 17' may be made of a nitride-based material. Other suitable materials for the second mask layer 17' are within the contemplated scope of the present disclosure.

Figure 3:
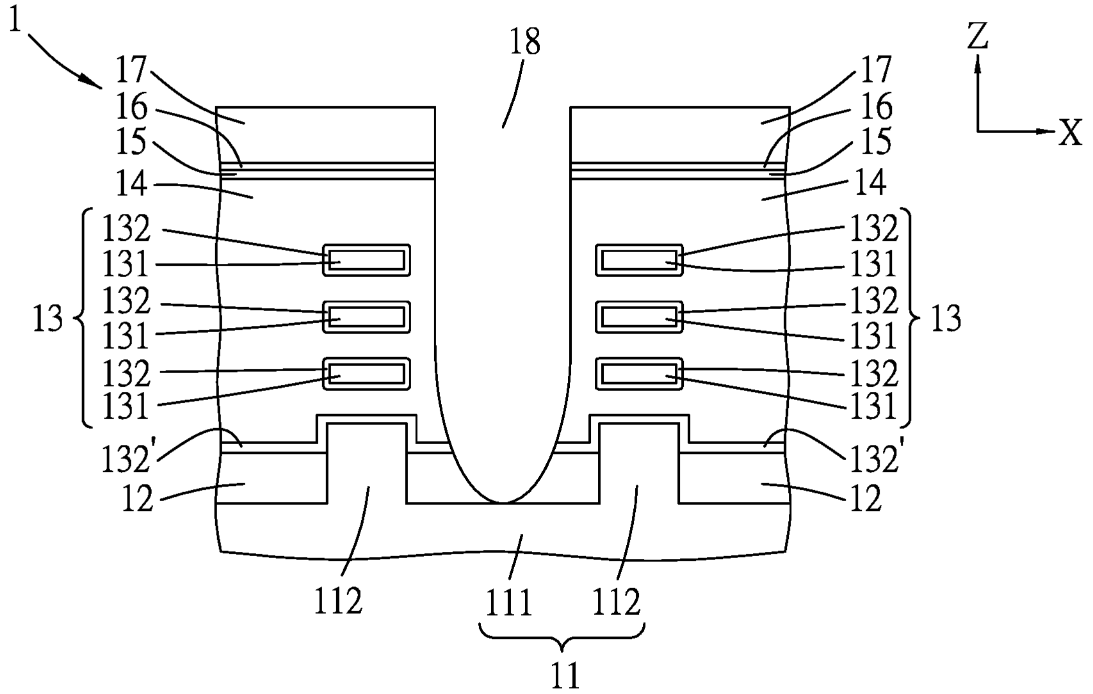

Referring to FIG. 1 and the example illustrated in FIG. 3, the method 100A then proceeds to step 102, where at least one trench 18 is formed in the semiconductor structure 1. Step 102 may be performed by photolithography, which includes an etching process. In this step, the trench 18 penetrates through the second mask layer 17', the stop layer 16', the first mask layer 15', the metal layer 14', the high-k material layer 132' and a corresponding one of the isolation portions 12, and terminates at the lower portion 111 of the semiconductor substrate 11. After this step, the second mask layer 17' is formed into a plurality of second mask portions 17, the stop layer 16' is formed into a plurality of stop portions 16, the first mask layer 15' is formed into a plurality of first mask portions 15, the metal layer 14' is formed into a plurality of metal portions 14, and the high-k material layer 132' and the corresponding one of the isolation portions 12 are partially removed. In some embodiments, each of the nanosheet structures 13 and a corresponding one of the metal portions 14 may be used in an n-type metal-oxide semiconductor field-effect transistor (NMOSFET) or a p-type metal-oxide-semiconductor field-effect transistor (PMOSFET). In some embodiments, each of the metal portions 14 may be referred to as a metal gate.

Figure 4:
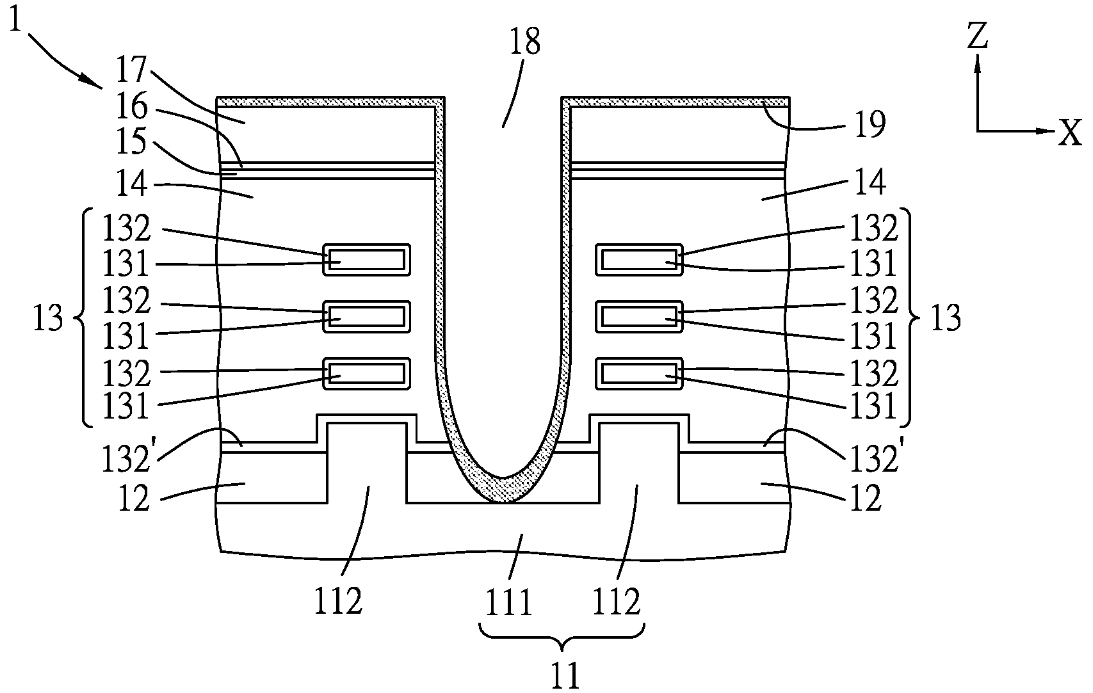

Referring to FIG. 1 and the example illustrated in FIG. 4, the method 100A then proceeds to step 103, where a first dielectric layer 19 is conformally formed over the structure shown in FIG. 3. The first dielectric layer 19 may serve as a liner layer. Step 103 may be performed by a suitable deposition process, for example, but not limited to, chemical vapor deposition (CVD), physical vapor deposition (PVD), atomic layer deposition (ALD), or other suitable deposition processes. The first dielectric layer 19 may be made of a low-k dielectric material, such as silicon nitride or silicon carbon oxynitride. Other suitable low-k dielectric materials for the first dielectric layer 19 are within the contemplated scope of the present disclosure. The first dielectric layer 19 may have a thickness ranging from about 1 nm to about 3 nm.

Figure 5:
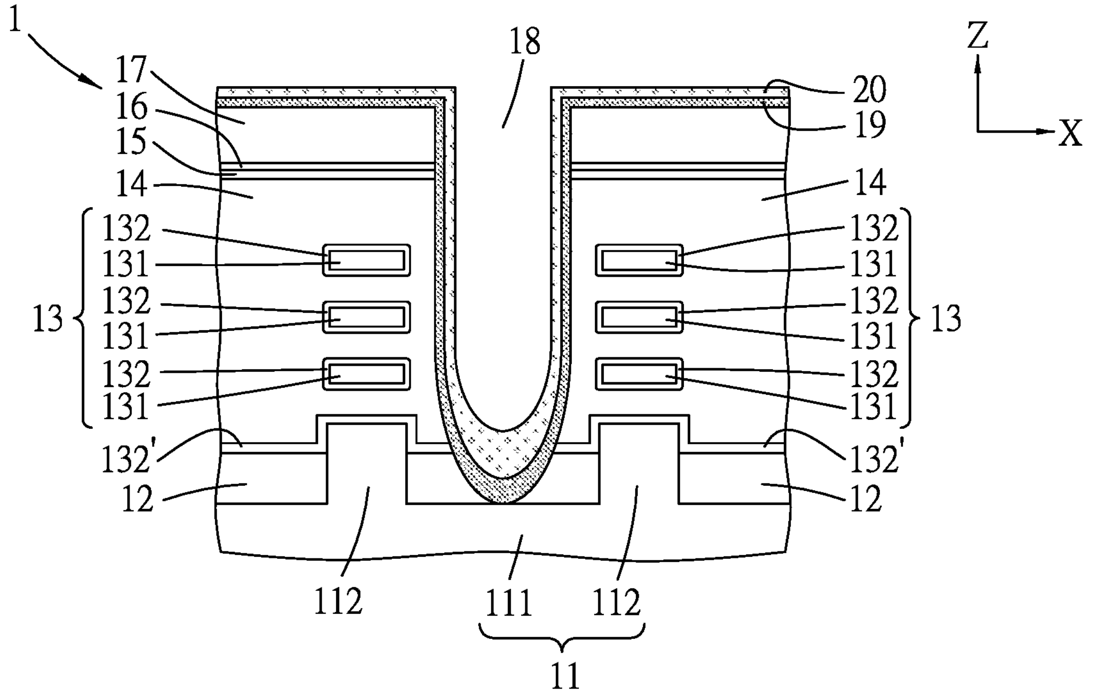

Referring to FIG. 1 and the example illustrated in FIG. 5, the method 100A then proceeds to step 104, where a dummy layer 20 is conformally formed over the structure shown in FIG. 4. Step 104 may be performed by a suitable deposition process, for example, but not limited to, CVD, PVD, ALD, or other suitable deposition processes. The dummy layer 20 may be made of silicon (Si), germanium (Ge), or aluminum oxide. Other suitable materials for the dummy layer 20 are within the contemplated scope of the present disclosure. The dummy layer 20 may have a thickness ranging from about 3 nm to about 6 nm. After this step, the dummy layer 20 may be slightly oxidized. The dummy layer 20 is used to prevent atoms (e.g., oxygen atoms) of a second dielectric layer 21 (which will be described hereinafter with reference to, for example, FIG. 6) from diffusing into the metal portions 14, which may result in an oxidation of the metal portions 14 and adversely affect a threshold voltage (Vt) of the semiconductor device 200A.

Figure 6:
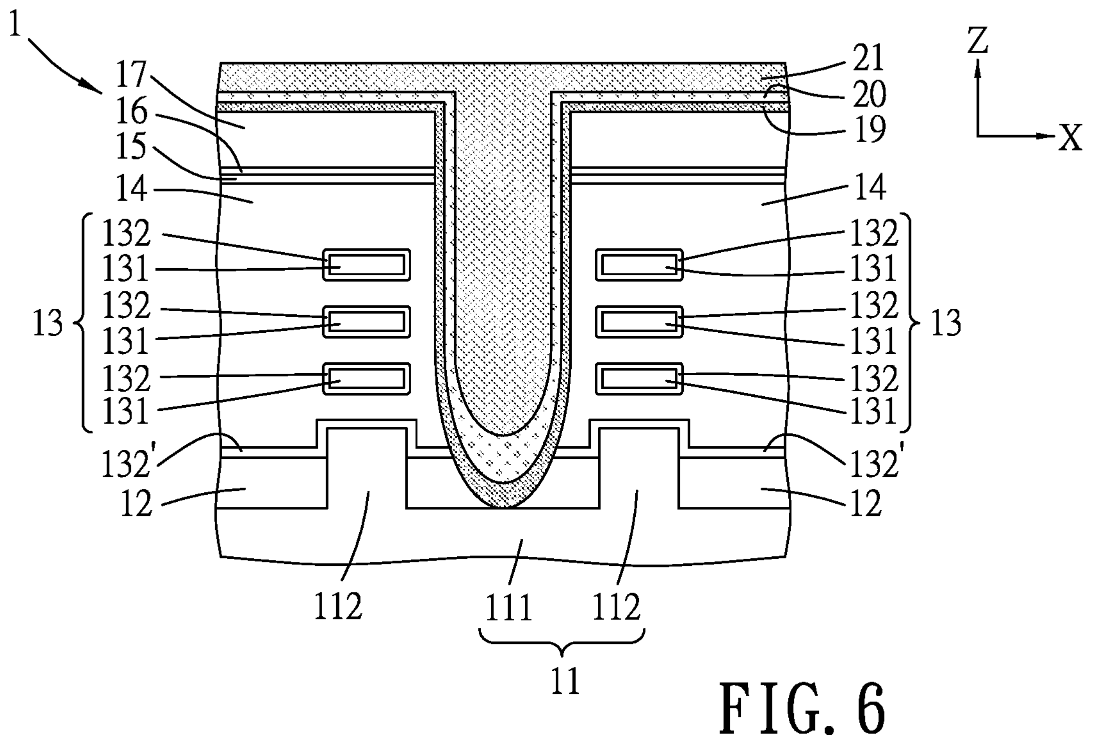

Referring to FIG. 1 and the example illustrated in FIG. 6, the method 100A then proceeds to step 105, where the second dielectric layer 21 is formed over the structure shown in FIG. 5 so as to fill the trench 18 (see FIG. 5). Step 105 may be performed by a suitable deposition process, for example, but not limited to, CVD, PVD, ALD, or other suitable deposition processes. The second dielectric layer 21 may be made of an oxide-based material (e.g., silicon oxide) or a nitride-based material (e.g., silicon nitride). Other suitable materials for the second dielectric layer 21 are within the contemplated scope of the present disclosure.

Figure 7A:
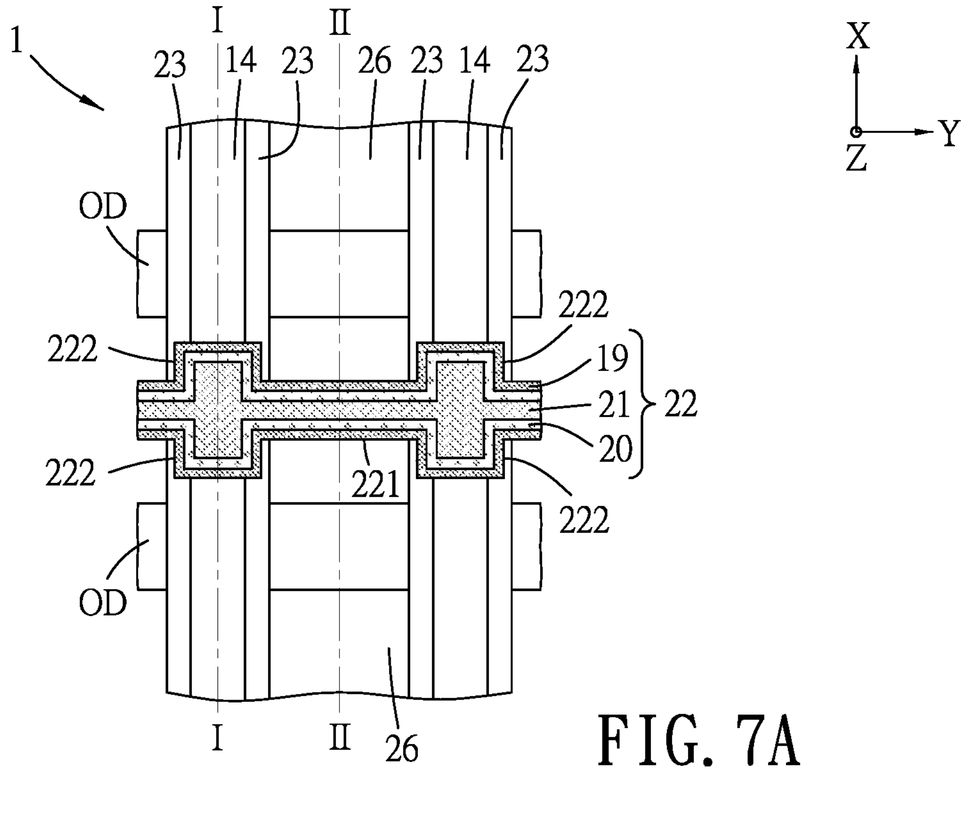
Figure 7B:
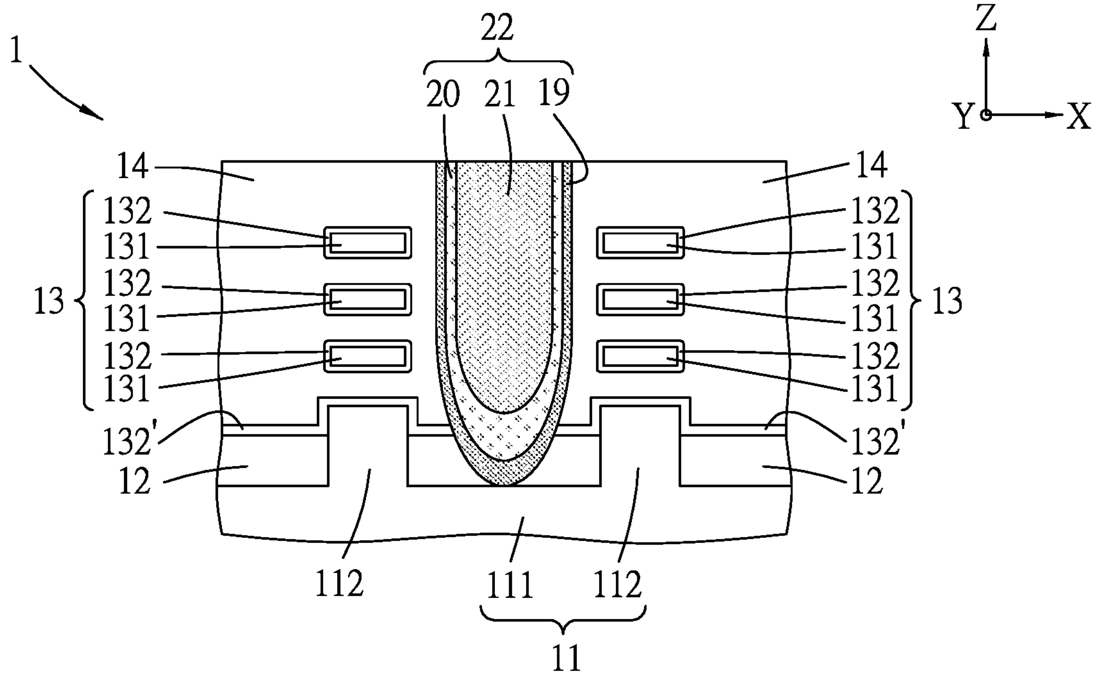
Figure 7C:
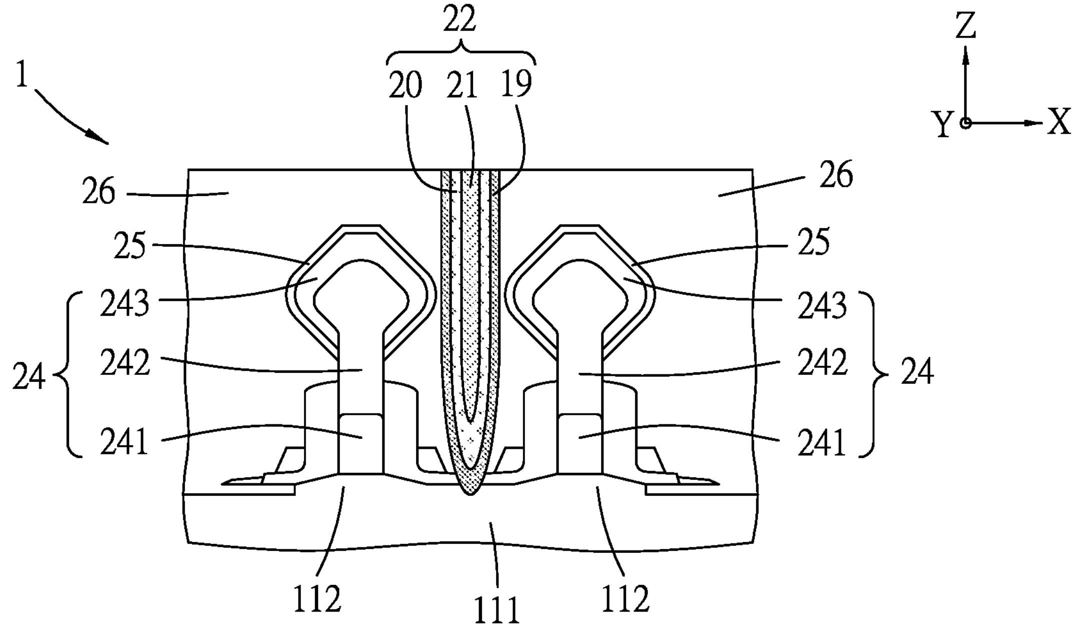

Referring to FIG. 1 and the example illustrated in FIGS. 7A to 7C, the method 100A then proceeds to step 106, where a planarization process is performed to remove excess portions of the structure shown in FIG. 6, until upper surfaces of the metal portions 14 are exposed. FIG. 7B illustrates a cross-sectional view taken along line I-I of FIG. 7A. FIG. 7C illustrates a cross-sectional view taken along line II-II of FIG. 7A. The planarization process may be, for example, but not limited to, chemical mechanical polishing (CMP) or other suitable planarization processes. In this step, a portion of the second dielectric layer 21, a portion of the dummy layer 20, a portion of the first dielectric layer 19, the second mask portions 17 (see FIG. 6), the stop portions 16 (see FIG. 6), and the first mask portions 15 (see FIG. 6) are removed. After this step, remaining portions of the first dielectric layer 19, the dummy layer 20, and the second dielectric layer 21 may be collectively referred to as an isolation structure 22. In some embodiments, the isolation structure 22 may have a critical dimension ranging from about 15 nm to about 60 nm in the X direction. In some embodiments, the isolation structure 22 may be referred to as a cut metal gate.

As shown in FIG. 7A, the isolation structure 22 may include a main portion 221 and a plurality of jog portions 222. In some embodiments, the main portion 221 may extend in a Y direction transverse to the X and Z directions. In some embodiments, the jog portions 222 in each pair of the jog portions 222 may extend from the main portion 221 oppositely in the X direction, in which case, each of the jog portions 222 in each pair is disposed between the main portion 221 and a corresponding one of the metal portions 14. Each pair of the jog portions 222 is spaced apart from an adjacent pair of the jog portions 222 in the Y direction. In some embodiments, each of the jog portions 222 may have a rectangular shape. In some embodiments, the semiconductor structure 1 further includes a plurality of gate spacers 23, and each pair of the gate spacers 23 is disposed at two opposite sides of a corresponding one of the metal portions 14. In some embodiments, each of the gate spacers 23 may be formed as a single layer structure or a multi-layered structure (for example, but not limited to, a two-layered structure). In some embodiments, the nanosheet structures 13 (see FIG. 7B) are located at a plurality of oxide-definition (OD) regions, respectively.

As shown in FIG. 7C, the semiconductor structure 1 further includes a plurality of source/drain features 24, a plurality of contact etch stop features 25, and a plurality of interlayer dielectric (ILD) features 26. Two adjacent ones of the source/drain features 24 are separated by the isolation structure 22. The source/drain features 24 are disposed on the upper portions 112 of the semiconductor substrate 11, respectively. Each of the source/drain features 24 may include a first layer 241, a second layer 242, and a third layer 243. The first layer 241 is disposed on a corresponding one of the upper portions 112 of the semiconductor substrate 11. The first layer 241 may be made of, for example, but not limited to, silicon (Si). The second layer 242 is disposed on the first layer 241 opposite to the corresponding one of the upper portions 112 of the semiconductor substrate 11, and may be made of, for example, but not limited to, silicon phosphide (SiP) or silicon germanium (SiGe). The third layer 243 is disposed on the second layer 242 opposite to the first layer 241, and may be made of, for example, but not limited to, silicon phosphide (SiP) or silicon germanium (SiGe). In some embodiments, the second layer 242 and the third layer 243 may be made of the same material, and may have different doping concentrations. In some embodiments, when the source/drain features 24 have n-type conductivity, the second layer 242 and the third layer 243 are made of silicon phosphide (SiP). In alternative embodiments, when the source/drain features 24 have p-type conductivity, the second layer 242 and the third layer 243 are made of silicon germanium (SiGe). Each of the contact etch stop features 25 covers the third layer 243 of a corresponding one of the source/drain features 24. The contact etch stop features 25 may include, for example, but not limited to, silicon nitride, carbon-doped silicon nitride, other suitable contact etch stop materials, or combinations thereof. The ILD features 26 are respectively disposed on the contact etch stop features 25 and other structures. Two adjacent ones of the ILD features 26 are separated by the isolation structure 22. The ILD features 26 may include, for example, but not limited to, silicon oxide, silicon nitride, silicon oxynitride, other suitable dielectric materials, or combinations thereof. Other suitable materials for the contact etch stop features 25 and the ILD features 26 are within the contemplated scope of the present disclosure.

Figure 8A:
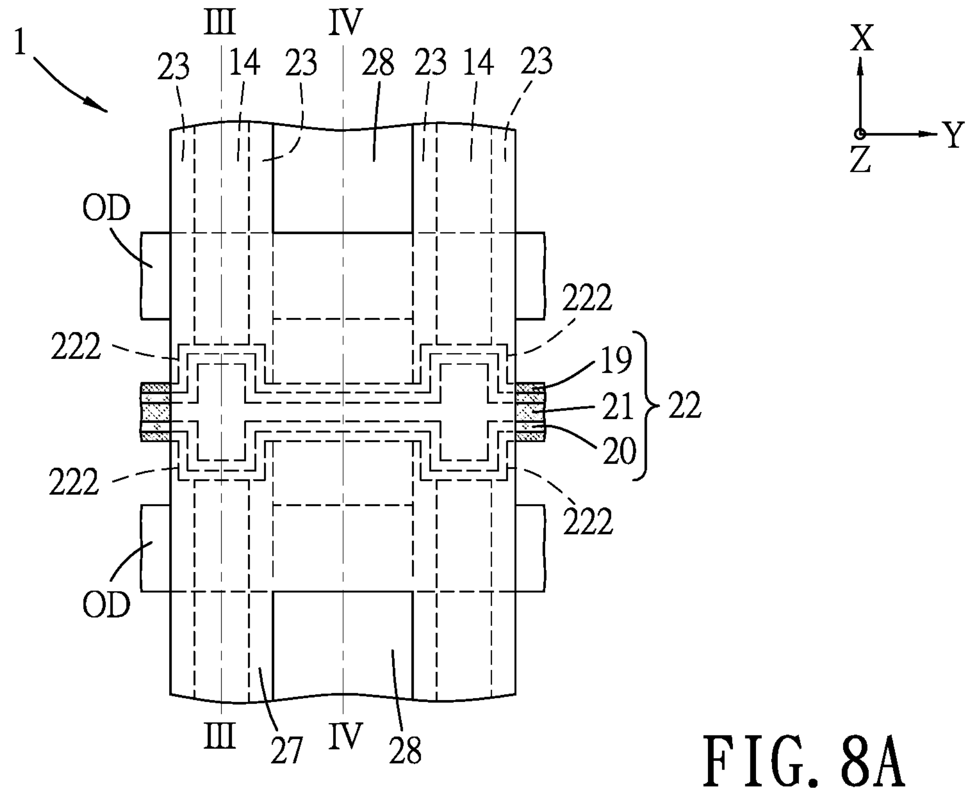
Figure 8B:
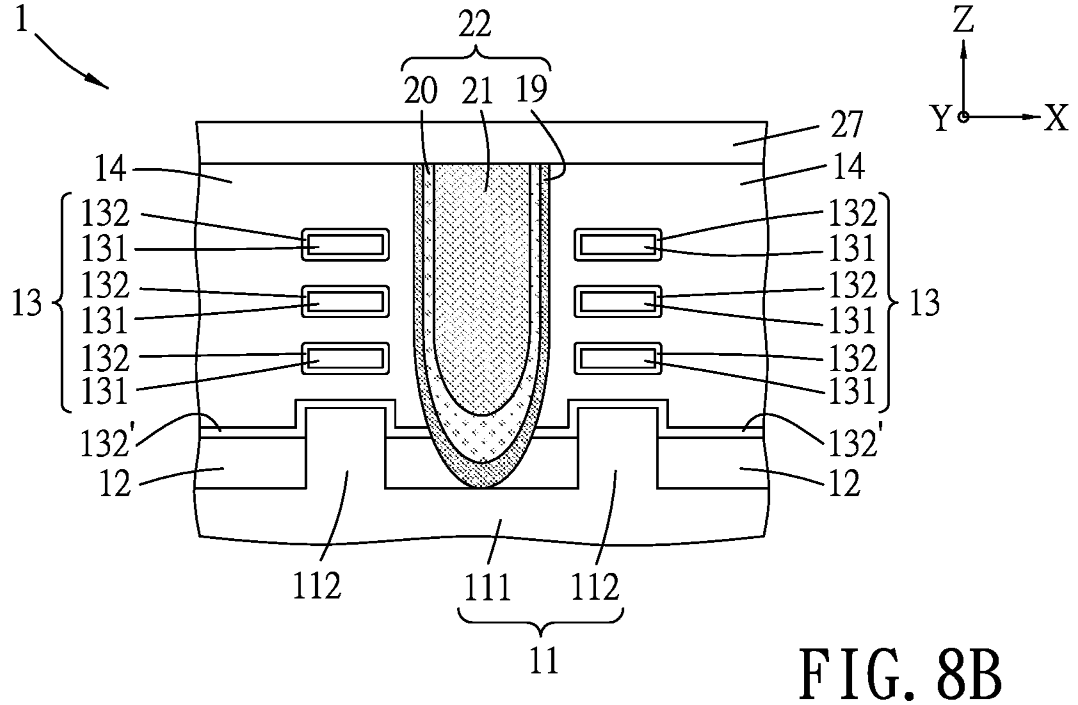
Figure 8C:
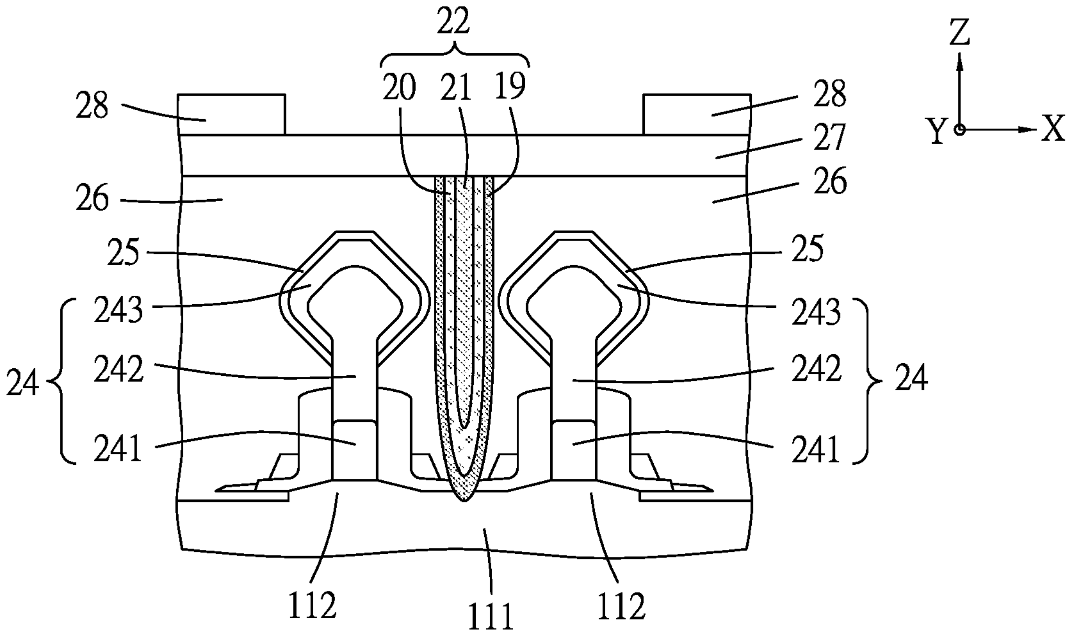

Referring to FIG. 1 and the example illustrated in FIGS. 8A to 8C, the method 100A then proceeds to step 107, where a first contact etch stop layer (CESL) 27 and a patterned mask layer 28 are sequentially formed on the structure shown in FIGS. 7A to 7C. FIG. 8B illustrates a cross-sectional view taken along line III-III of FIG. 8A. FIG. 8C illustrates a cross-sectional view taken along line IV-IV of FIG. 8A. Step 107 may be performed by sequentially depositing the first CESL 27 and a mask layer (not shown) for forming the patterned mask layer 28 on the structure shown in FIGS. 7A to 7C, followed by conducting a photolithography process (including an etching process) to pattern the mask layer, so as to obtain the patterned mask layer 28. The first CESL 27 may be deposited on the structure shown in FIGS. 7A to 7C by a suitable deposition process, for example, but not limited to, CVD or other suitable deposition processes. The material for forming the first CESL 27 may be the same as or similar to that for forming the contact etch stop features 25 as described in step 106, and thus details thereof are omitted for the sake of brevity. The mask layer for forming the patterned mask layer 28 may be made of, for example, but not limited to, an oxide-based material or a nitride-based material. As shown in FIG. 8B, the first CESL 27 is deposited on the metal portions 14 and the isolation structure 22. As shown in FIG. 8C, the first CESL 27 is also deposited on the ILD features 26 and the isolation structure 22, and the patterned mask layer 28 is formed on the first CESL 27.

Figure 9A:
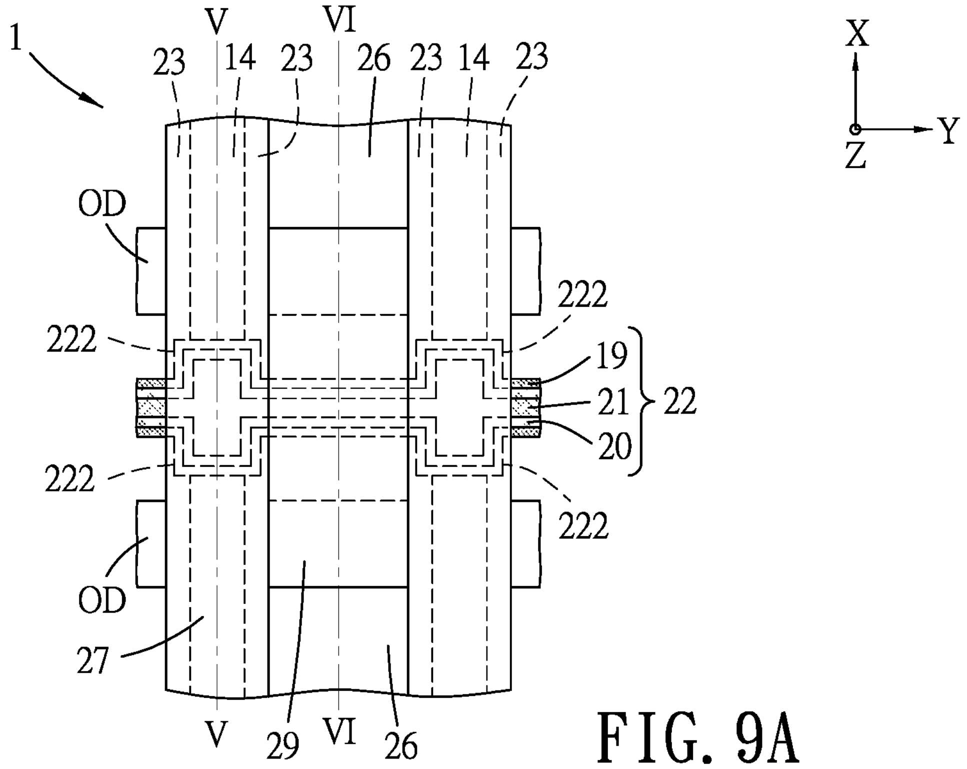
Figure 9B:
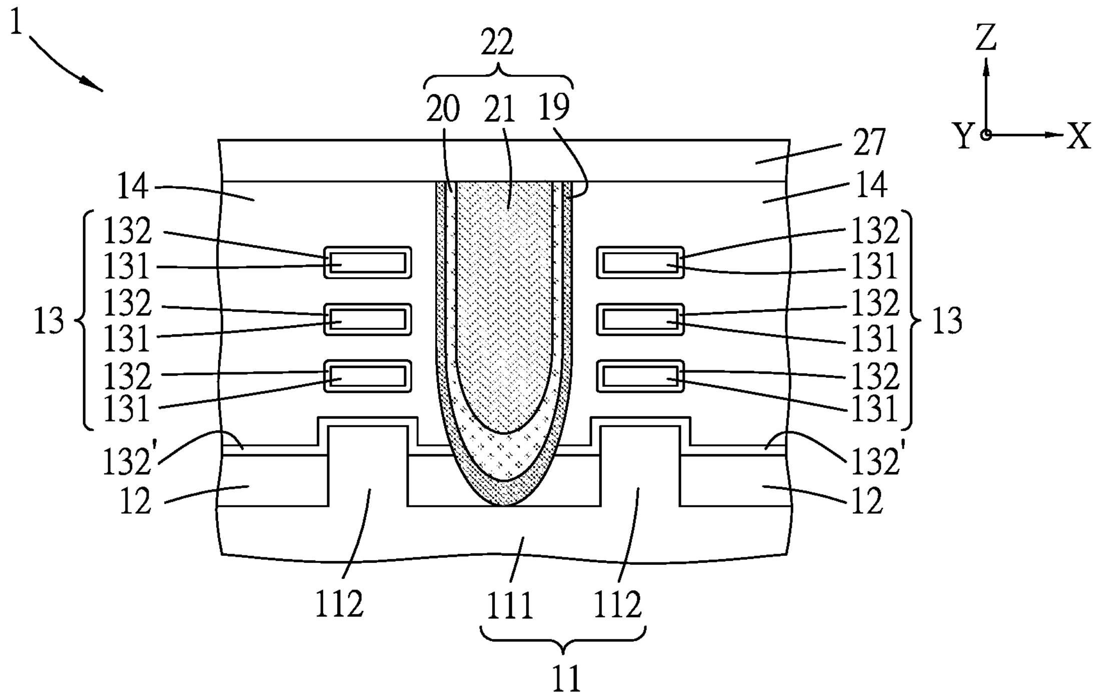
Figure 9C:
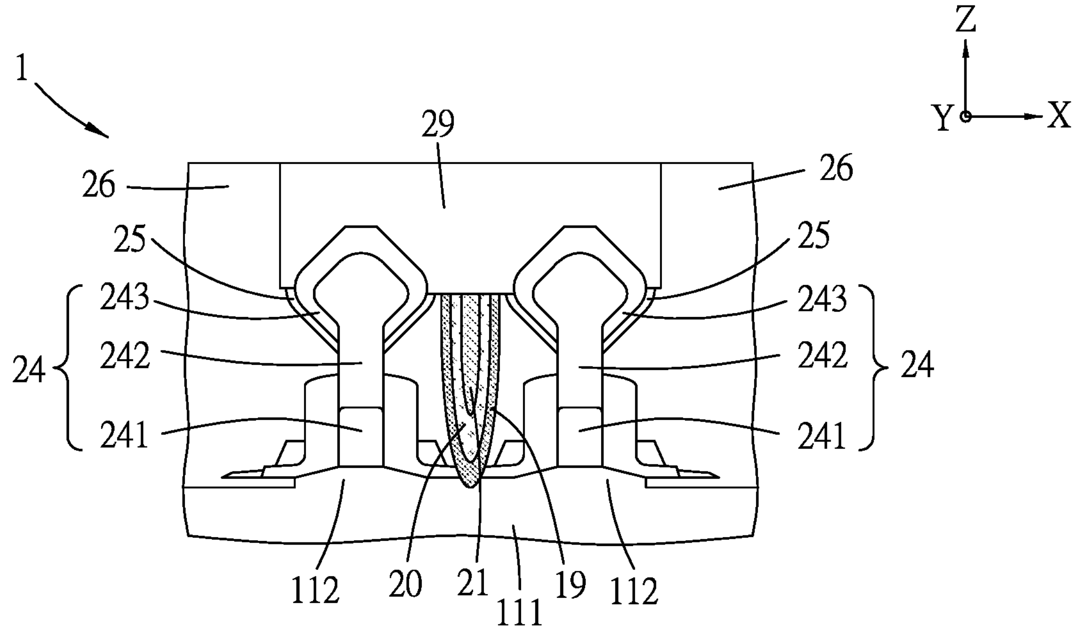

Referring to FIG. 1 and the example illustrated in FIGS. 9A to 9C, the method 100A then proceeds to step 108, where the first CESL 27, the isolation structure 22, the ILD features 26 and the contact etch stop features 25 are partially etched, followed by sequentially forming a conductive feature 29 and performing a planarization process. FIG. 9B illustrates a cross-sectional view taken along line V-V of FIG. 9A. FIG. 9C illustrates a cross-sectional view taken along line VI-VI of FIG. 9A. Step 108 may include sub-steps (i) to (iii).

In sub-step (i), a plurality of etching processes (e.g., dry etching) are sequentially performed to partially etch the first CESL 27, the ILD features 26, the isolation structure 22 and the contact etch stop features 25. In this sub-step, the patterned mask layer 28 (see FIGS. 8A and 8C) is used as a mask. After this sub-step, the source/drain features 24 are partially exposed.

In sub-step (ii), the conductive feature 29 is formed on exposed portions of the source/drain features 24 and an unetched portion of the isolation structure 22. The conductive feature 29 may be made of, for example, but not limited to, tungsten (W), cobalt (Co), ruthenium (Ru), molybdenum (Mo), or combinations thereof. Other suitable materials for the conductive feature 29 are within the contemplated scope of the present disclosure. The conductive feature 29 may be formed by a suitable deposition process, for example, but not limited to, CVD, PVD, ALD, or other suitable deposition processes.

In sub-step (iii), a planarization process (e.g., CMP or other suitable planarization processes) is performed to fully remove the patterned mask layer 28 and an unetched portion of the first CESL 27, and to partially remove an unetched portion of the ILD features 26, and an excess portion of the conductive feature 29. After this sub-step, the conductive feature 29 and the metal portions 14 are flush with each other.

In some embodiments, after sub-step (i) and before sub-step (ii), a spacer layer (not shown) may be conformally formed on a side of each of the gate spacers 23 that is distal from a corresponding one of the metal portions 14 and other structures (e.g., the exposed portions of the source/drain features 24), followed by etching back (e.g., anisotropically etching) a portion of the spacer layer. A remaining portion of the spacer layer is formed as a spacer on the side of each of the gate spacers 23. The spacer thus formed is conducive to preventing electrical leakage among the metal portions 14 and the conductive feature 29. The spacer may be made of, for example, but not limited to, a nitride-based material.

Figure 10A:
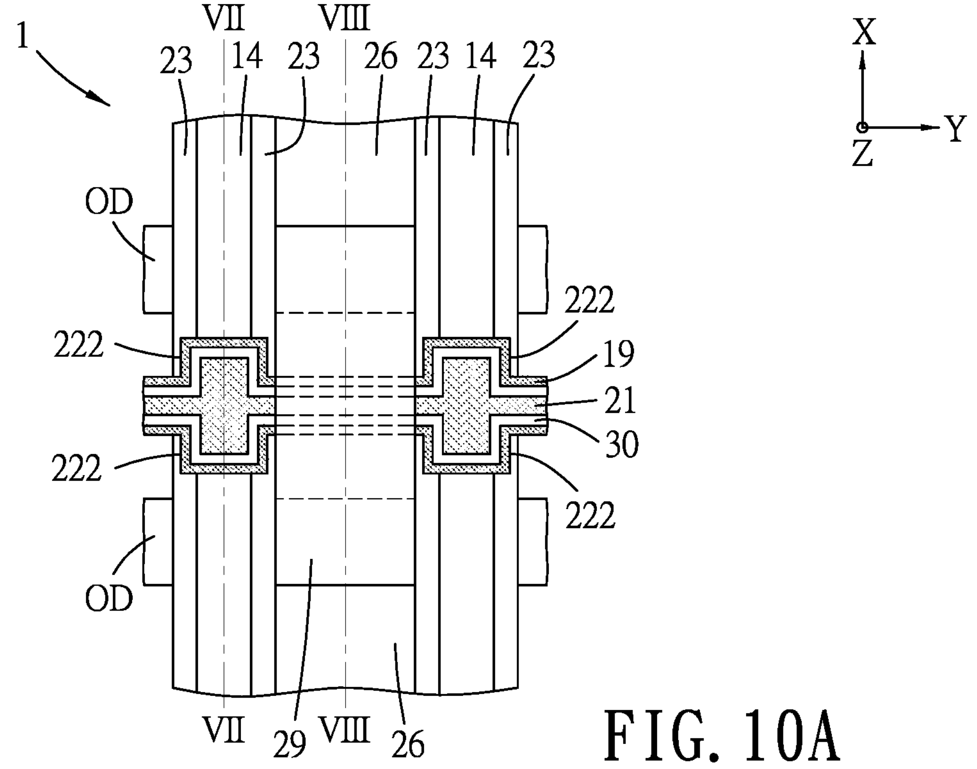
Figure 10B:
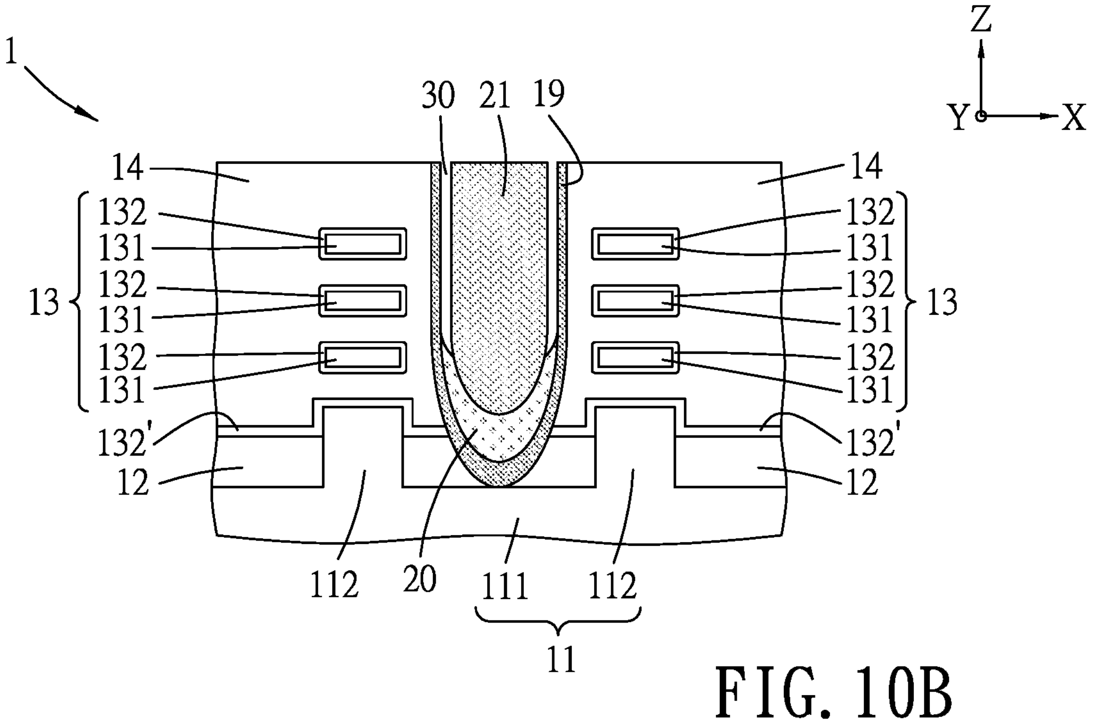
Figure 10C:
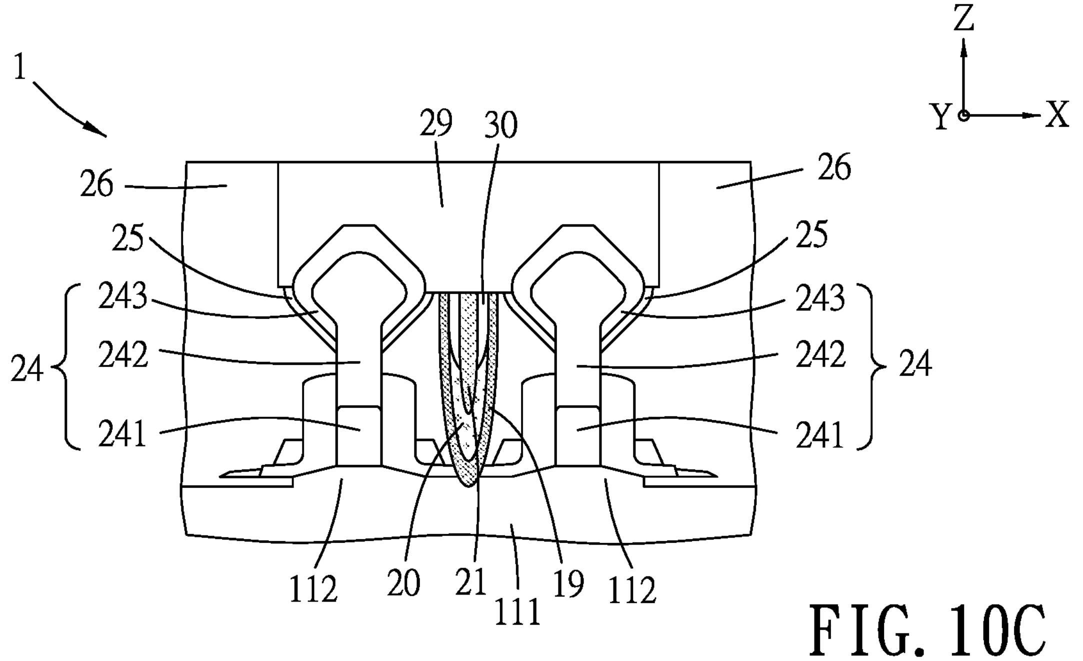

Referring to FIG. 1 and the example illustrated in FIGS. 10A to 10C, the method 100A then proceeds to step 109, where the dummy layer 20 is partially removed. FIG. 10B illustrates a cross-sectional view taken along line VII-VII of FIG. 10A. FIG. 10C illustrates a cross-sectional view taken along line VIII-VIII of FIG. 10A. Step 109 may be performed by dry etching or wet etching. In some embodiments, in the wet etching process, an oxidized portion of the dummy layer 20 is etched away using a suitable etchant (for example, but not limited to, hydrofluoric acid (HF)), and the dummy layer 20 is then partially etched away using another suitable etchant (for example, but not limited to, ammonium hydroxide ($NH_4OH$)). In some embodiments, in the dry etching process, the oxidized portion of the dummy layer 20 is etched away in a first dry etching stage, and the dummy layer 20 is then partially etched away in a second dry etching stage. As shown in FIGS. 10B and 10C, after this step, a gap 30 is formed among the first dielectric layer 19, the second dielectric layer 21, and a remaining portion of the dummy layer 20. In some embodiments, the second dielectric layer 21 may have a dimension in the X direction ranging from about 10 nm to about 30 nm.

Figure 11A:
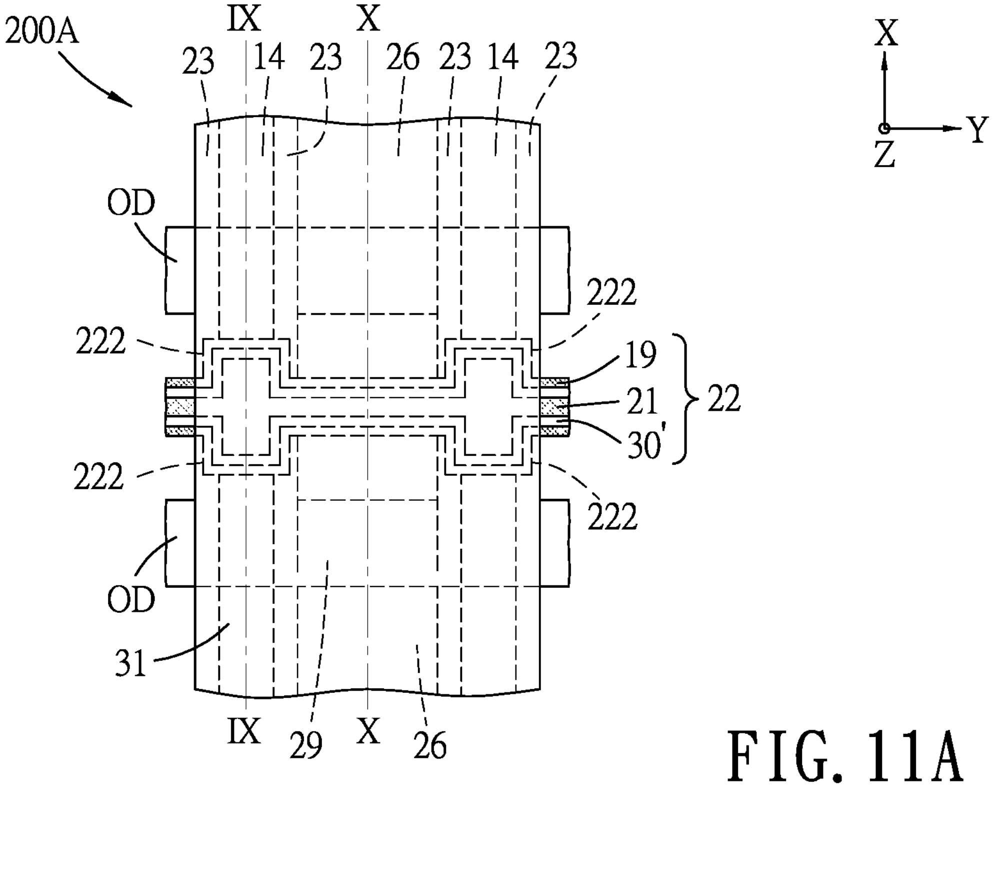
Figure 11B:
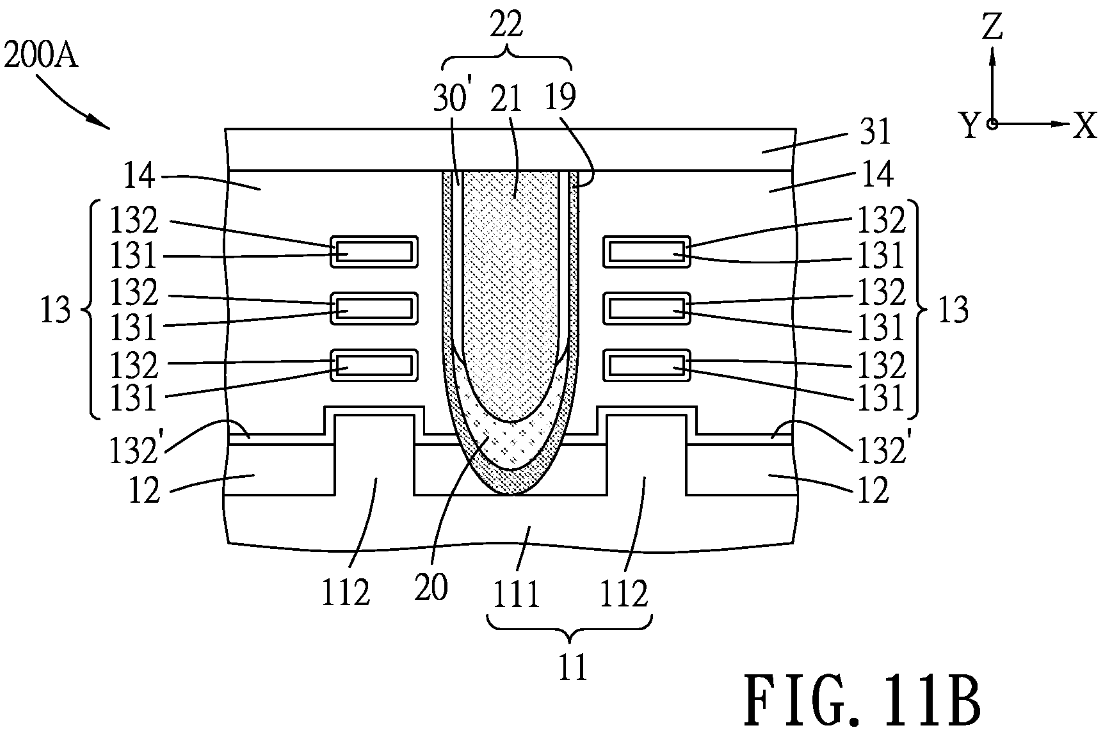
Figure 11C:
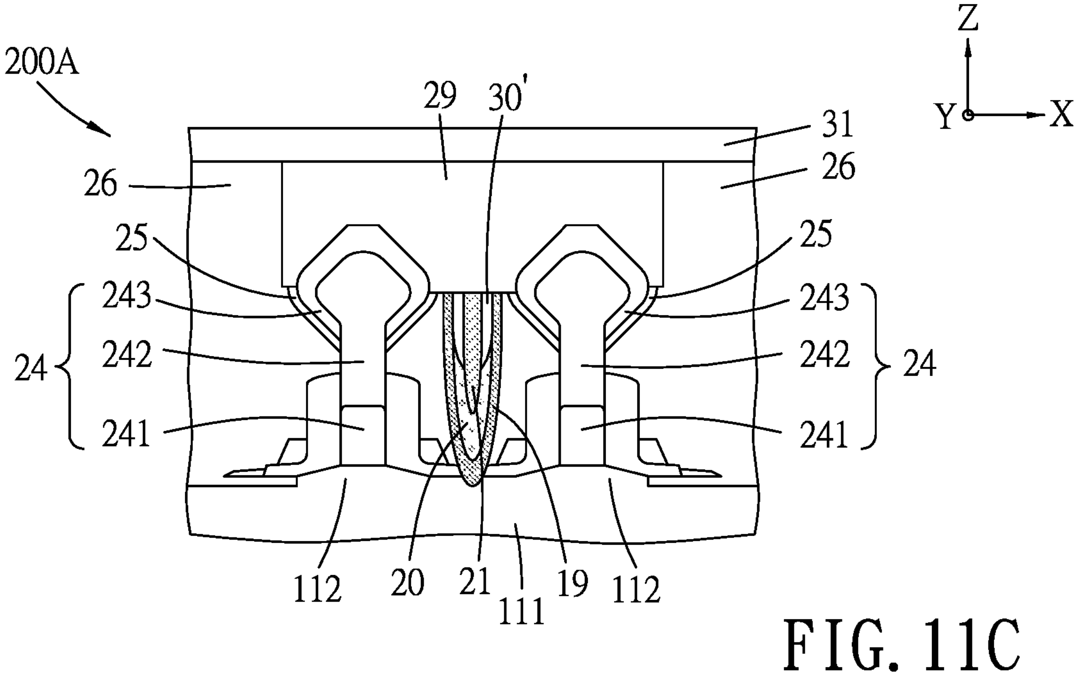

Referring to FIG. 1 and the example illustrated in FIGS. 11A to 11C, the method 100A then proceeds to step 110, where a second CESL 31 is formed on the structure shown in FIGS. 10A to 10C so as to seal the gap 30. The material and process for forming the second CESL 31 may be the same as or similar to those for forming the first CESL 27 as described in step 107, and thus details thereof are omitted for the sake of brevity. In some embodiments, the second CESL 31 may be made of, for example, but not limited to, germanium, and may be formed by implanting. In this step, the second CESL 31 may fill a small upper portion of the gap 30 as described in step 109. In some embodiments, the gap 30 may be referred to as an air gap 30'. In some embodiments, the air gap 30' has a width ranging from about 1 nm to about 6 nm. After this step, the semiconductor device 200A is therefore obtained. By having the air gap 30' formed in the isolation structure 22, a capacitor structure formed between the conductive feature 29 and a corresponding one of the metal portions 14 may have a reduced capacitance, which is conducive to mitigating resistance capacitance (RC) time delay of the semiconductor device 200A, and further improving device performance of the semiconductor device 200A.

As described above with reference in FIG. 4, the first dielectric layer 19 may have a thickness ranging from about 1 nm to about 3 nm. When the thickness of the first dielectric layer 19 is less than about 1 nm, the contact etch stop feature 25 and the source/drain features 24 may be damaged when the dummy layer 20 is partially removed (i.e., step 109). When the thickness of the first dielectric layer 19 is greater than about 3 nm, a width of the air gap 30' may be reduced, which is not conducive to reducing the capacitance of the capacitor structure formed between the conductive feature 29 and a corresponding one of the metal portions 14.

Figure 12:
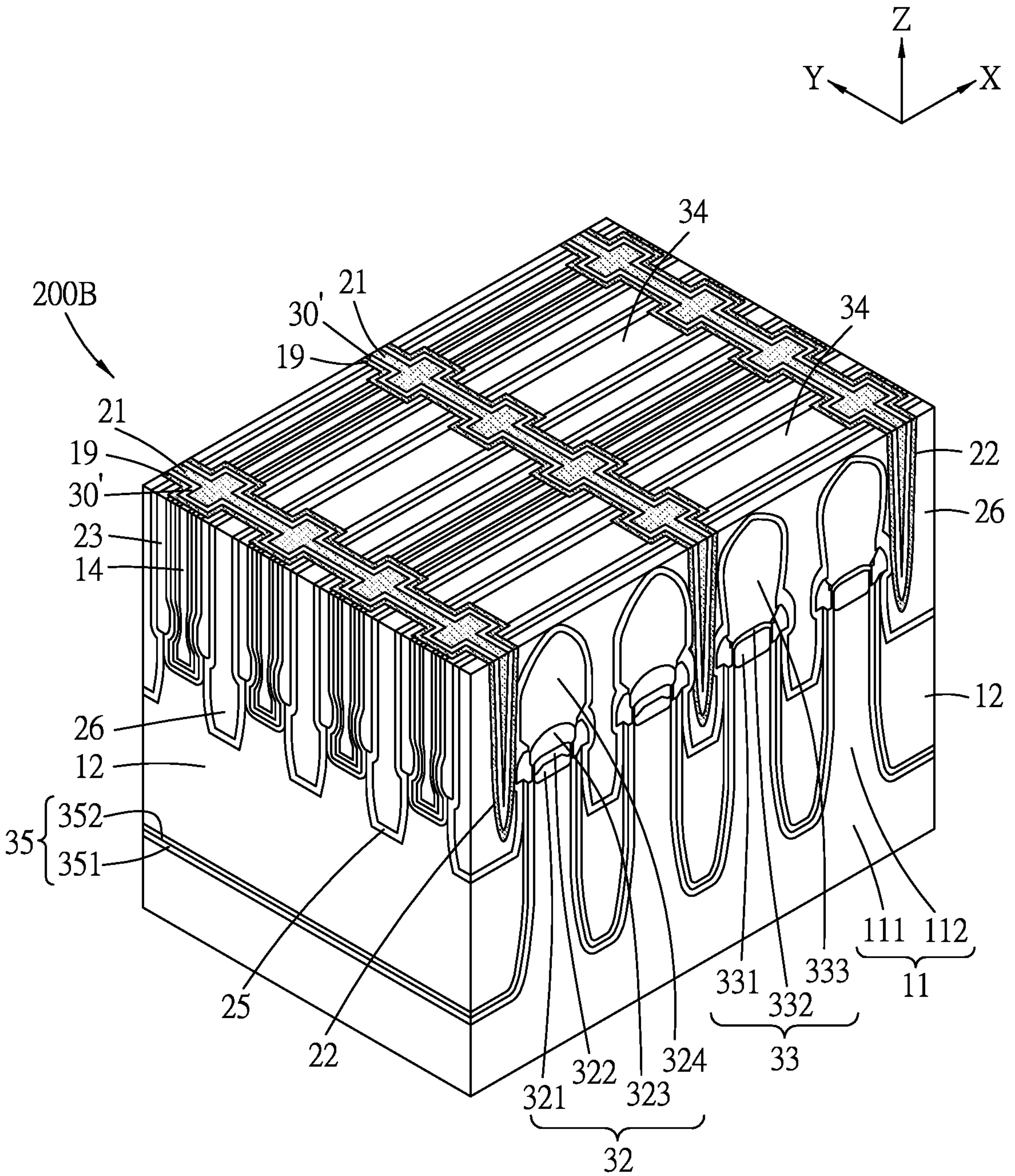
FIG. 12 is a schematic perspective view of a semiconductor device in accordance with some embodiments.

FIG. 12 illustrates a schematic perspective view of a semiconductor device 200B (without the second CESL 31 described above with reference in FIGS. 11A to 11C) in accordance with some embodiments. The semiconductor device 200B is similar to the semiconductor device 200A except for the following differences.

The semiconductor device 200B may include a plurality of first type source/drain features 32 and a plurality of second type source/drain features 33.

In some embodiments, each of the first type source/drain features 32 may include a first layer 321, a second layer 322, a third layer 323, and a fourth layer 324 that are sequentially disposed on a corresponding one of the upper portions 112 of the semiconductor substrate 11. The first layer 321 is disposed on the corresponding one of the upper portions 112 of the semiconductor substrate 11. The first layer 321 may be made of a semiconductor material, for example, but not limited to, silicon (Si). The second layer 322 is disposed on the first layer 321 opposite to the corresponding one of the upper portions 112 of the semiconductor substrate 11. The second layer 322 may be made of a dielectric material, for example, but not limited to, silicon oxide or silicon nitride. Other suitable materials for the second layer 322 are within the contemplated scope of the present disclosure. In some embodiments, the second layer 322 may be referred to as a bottom dielectric isolation (BDI). The third layer 323 is disposed on the second layer 322 opposite to the first layer 321. The third layer 323 may be made of, for example, but not limited to, silicon (Si). The fourth layer 324 is disposed on the third layer 323 opposite to the second layer 322. The fourth layer 324 may be made of, for example, but not limited to, silicon phosphide (SiP). In some embodiments, the first type source/drain features 32 may have an n-type conductivity. In some embodiments, two adjacent ones of the first type source/drain features 32 in the Y direction may respectively serve as a source terminal and a drain terminal of a NMOSFET.

In some embodiments, each of the second type source/drain features 33 may include a first layer 331, a second layer 332, and a third layer 333 that are sequentially disposed on a corresponding one of the upper portions 112 of the semiconductor substrate 11. The first layer 331 is disposed on the corresponding one of the upper portions 112 of the semiconductor substrate 11. The first layer 331 may be made of, for example, but not limited to, silicon (Si). The second layer 332 is disposed on the first layer 331 opposite to the corresponding one of the upper portions 112 of the semiconductor substrate 11. The second layer 332 may be made of, for example, but not limited to, silicon (Si). The third layer 333 is disposed on the second layer 332 opposite to the first layer 331. The third layer 333 may be made of, for example, but not limited to, silicon germanium (SiGe). In some embodiments, the second type source/drain features 33 may have a p-type conductivity. In some embodiments, two adjacent ones of the second type source/drain features 33 in the Y direction may respectively serve as a source terminal and a drain terminal of a PMOSFET.

In some embodiments, the semiconductor device 200B may include a plurality of the NMOSFETs and a plurality of PMOSFETs.

In some embodiments, the semiconductor device 200B may further include a plurality of channel isolation layers 34 and a plurality of liners 35.

Each of the channel isolation layers 34 is disposed between two adjacent ones of the NMOSFETs or between two adjacent ones of the PMOSFETs. The channel isolation layers 34 may be made of a combination of an oxide-based material (for example, but not limited to, silicon oxide) and a nitride-based material (for example, but not limited to silicon nitride).

Each of the liners 35 is disposed between the semiconductor substrate 11 and a corresponding one of the isolation portions 12. The liners 35 may be made of an oxide-based material (for example, but not limited to, silicon oxide) or a nitride-based material (for example, but not limited to, silicon nitride). In some embodiments, each of the liners 35 may be formed as a multi-layered structure. In this case, each of the liners 35 may include a first portion 351 and a second portion 352, where the second portion 352 is disposed between the first portion 351 and a corresponding one of the isolation portions 12.

Figure 13:
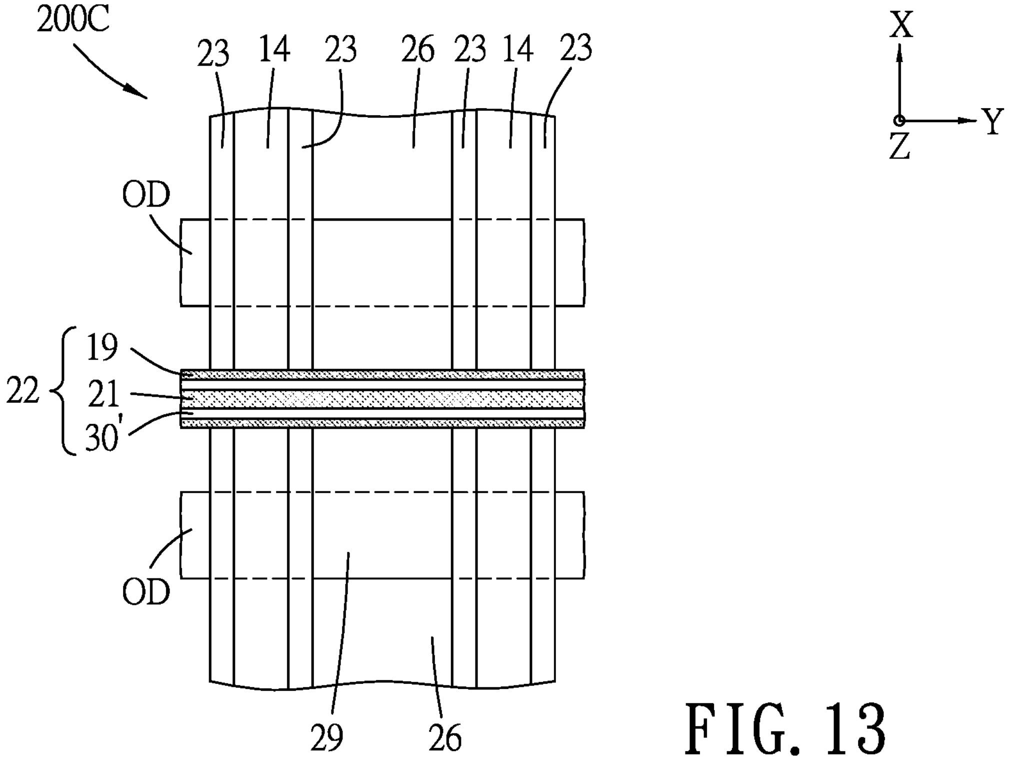
FIGS. 13 to 20 are schematic views respectively illustrating a plurality of semiconductor devices in accordance with some embodiments.
Figure 14:
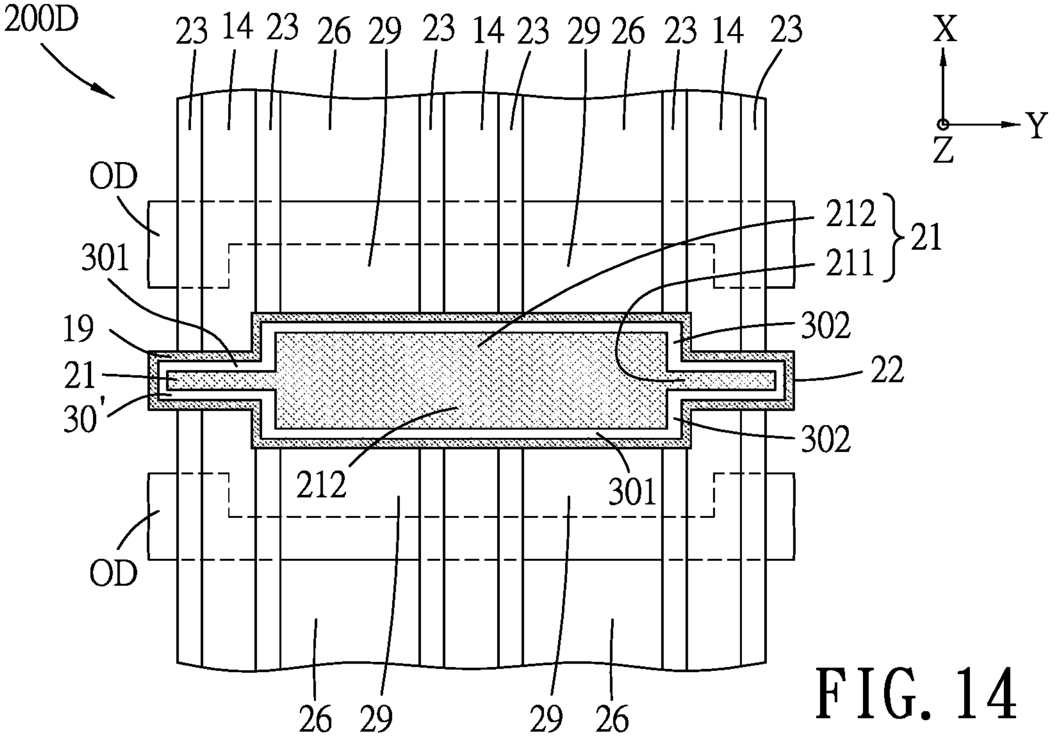
Figure 15:
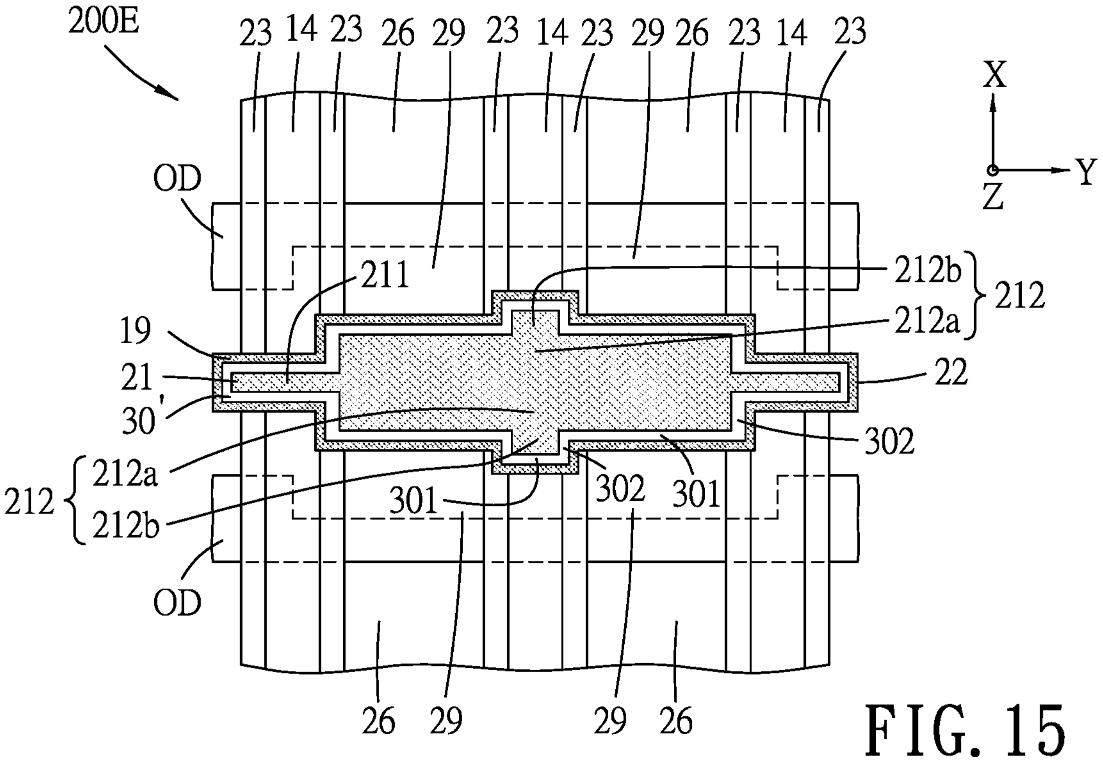

FIGS. 13 to 15 respectively illustrate schematic views of semiconductor devices 200C. 200D. 200E (without the second CESL 31 described above with reference in FIGS. 11A to 11C) in accordance with some embodiments. Each of the semiconductor devices 200C. 200D, 200E is generally similar to the semiconductor device 200A. The isolation structures 22 of the semiconductor devices 200C. 200D, 200E have different configurations. In these cases, the width of the air gap 30' of each of the semiconductor devices 200C, 200D, 200E ranges from about 1.0 nm to about 3.5 nm. In some embodiments, the configuration of the OD region may vary depending on the configuration of the isolation structure 22. For examples, as shown in FIGS. 14 and 15, the OD region of each of the semiconductor devices 200D, 200E may have a main portion and two jog portions that extend from the main portion toward the isolation structure 22.

Referring to FIG. 13, in the isolation structure 22 of the semiconductor device 200C, the second dielectric layer 21 extends in the Y direction and is spaced apart from the first dielectric layer 19 by the air gap 30'.

Referring to FIG. 14, in the isolation structure 22 of the semiconductor device 200D, the second dielectric layer 21 includes a main portion 211 extending in the Y direction and two jog portions 212 extending from the main portion 211 oppositely in the X direction. The second dielectric layer 21 is spaced apart from the first dielectric layer 19 by the air gap 30'. The air gap 30' is formed conformally around the second dielectric layer 21, and includes a plurality of first air gap portions 301 extending in the Y direction, and a plurality of second air gap portions 302 extending in the X direction and being in spatial communication with the first air gap portions 301.

Referring to FIG. 15, the configuration of the isolation structure 22 in the semiconductor device 200E is similar to that of the isolation structure 22 in the semiconductor device 200D except for the following differences. In the isolation structure 22 of the semiconductor device 200E, each of the two jog portions 212 includes a first jog part **212*a* extending from the main portion 211 in the X direction, and a second jog part 212***b* extending from the first jog part 212*a* and away from the main portion 211 in the X direction.

FIGS. 16 to 19 respectively illustrate schematic views of semiconductor devices 200F. 200G, 200H, 200I (without the second CESL 31 described above with reference in FIGS. 11A to 11C) in accordance with some embodiments. In the semiconductor devices 200F, 200G, 200H, 200I, the width of the air gap 30' ranges from about 4 nm to about 6 nm.

Figure 16:
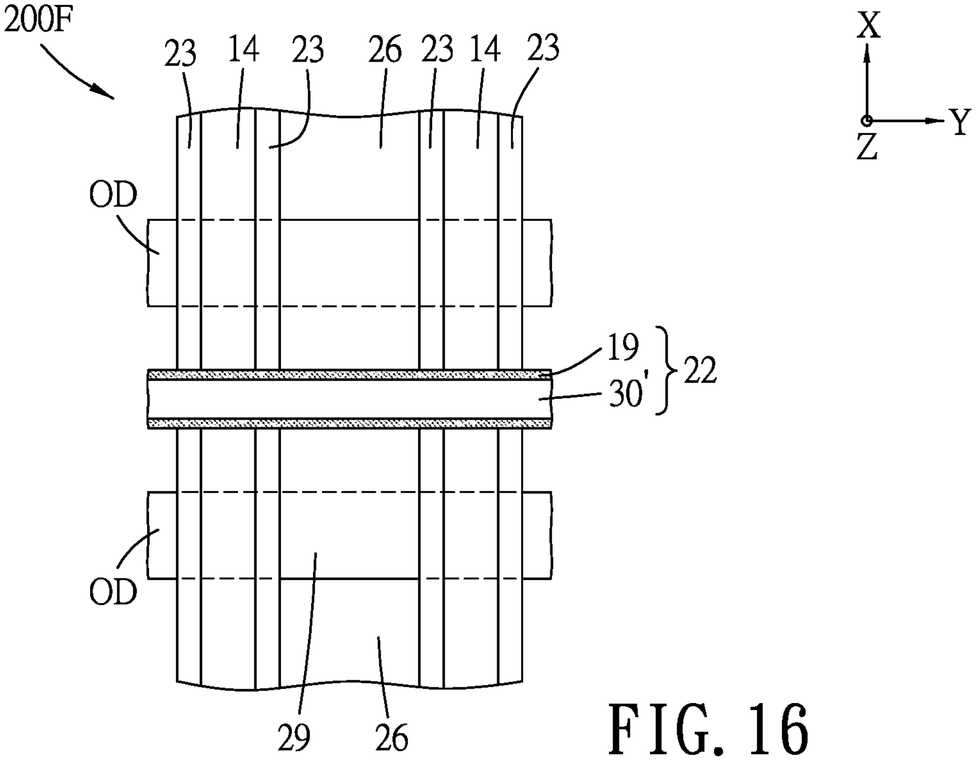

Referring to FIG. 16, the isolation structure 22 of the semiconductor device 200F may not include the second dielectric layer 21 as described above. Therefore, the air gap 30' is defined by the first dielectric layer 19 and extends in the Y direction.

Figure 17:
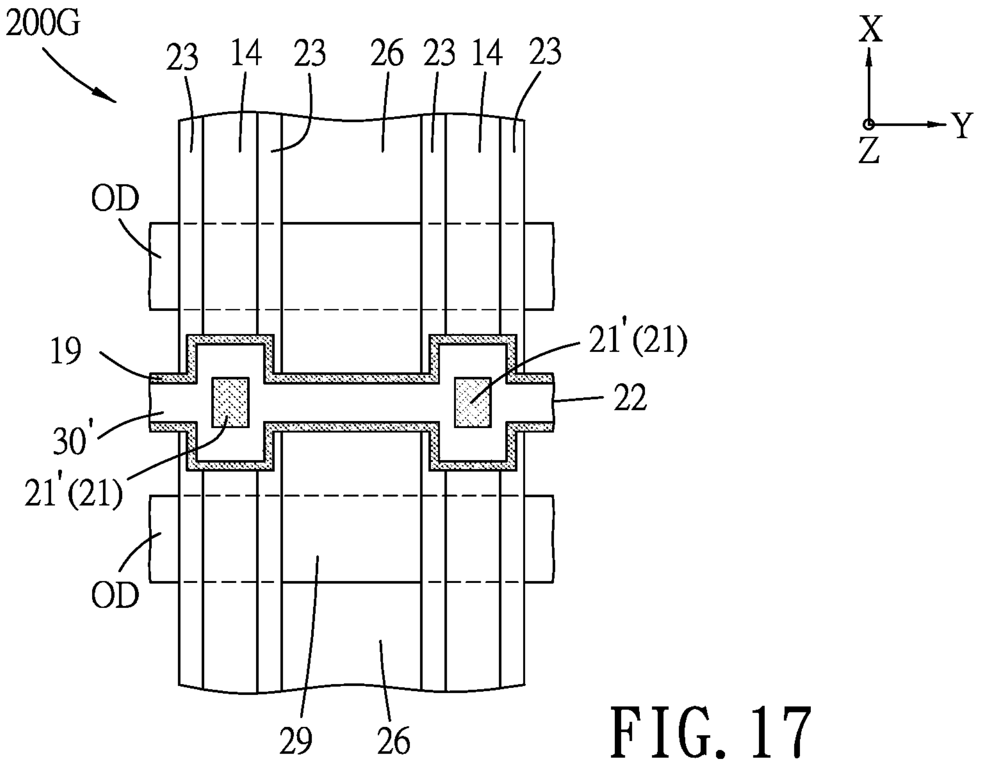

Referring to FIG. 17, in the isolation structure 22 of the semiconductor device 200G, the second dielectric layer 21 includes a plurality of dielectric portions 21' spaced apart from each other in the Y direction. Two of the dielectric portions 21' are shown in FIG. 17. The second dielectric layer 21 is spaced apart from the first dielectric layer 19 by the air gap 30'.

Figure 18:
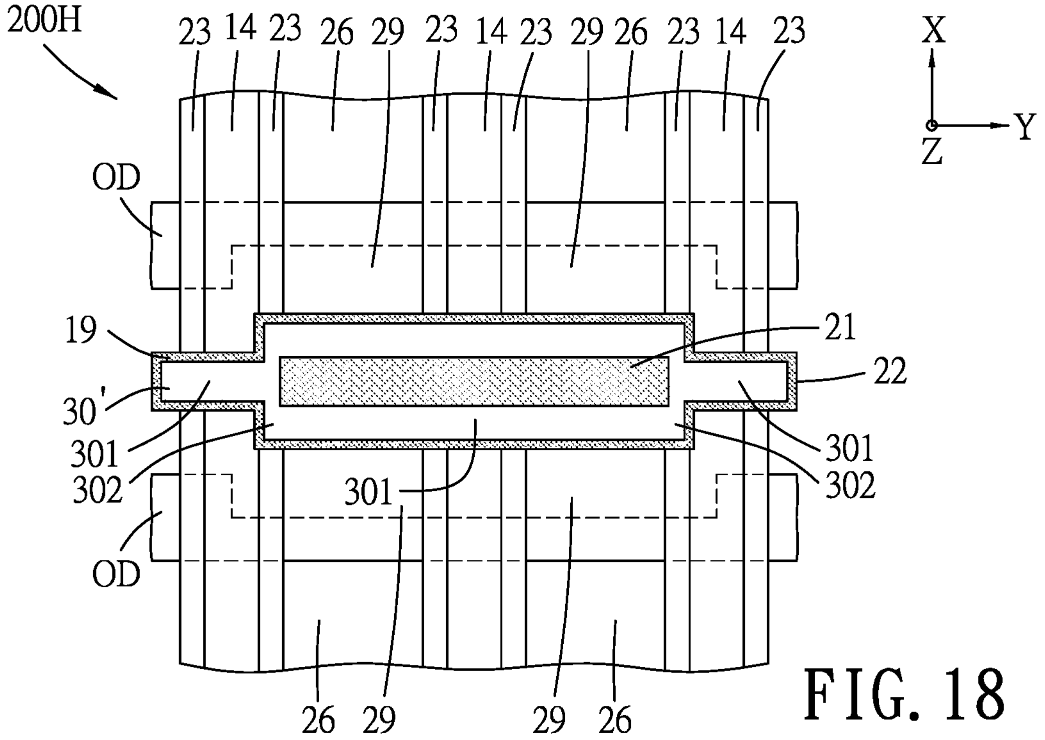

Referring to FIG. 18, the configuration of the isolation structure 22 in the semiconductor device 200H is similar to that of the isolation structure 22 in the semiconductor device 200D. The second dielectric layer 21 of the isolation structure 22 in the semiconductor device 200H extends in the Y direction and is not formed with the jog portions 212 shown in FIG. 14. The dimension of the second dielectric layer 21 in the X direction is smaller than the maximum dimension in the X direction of the second dielectric layer 21 of the isolation structure 22 in the semiconductor device 200D.

Figure 19:
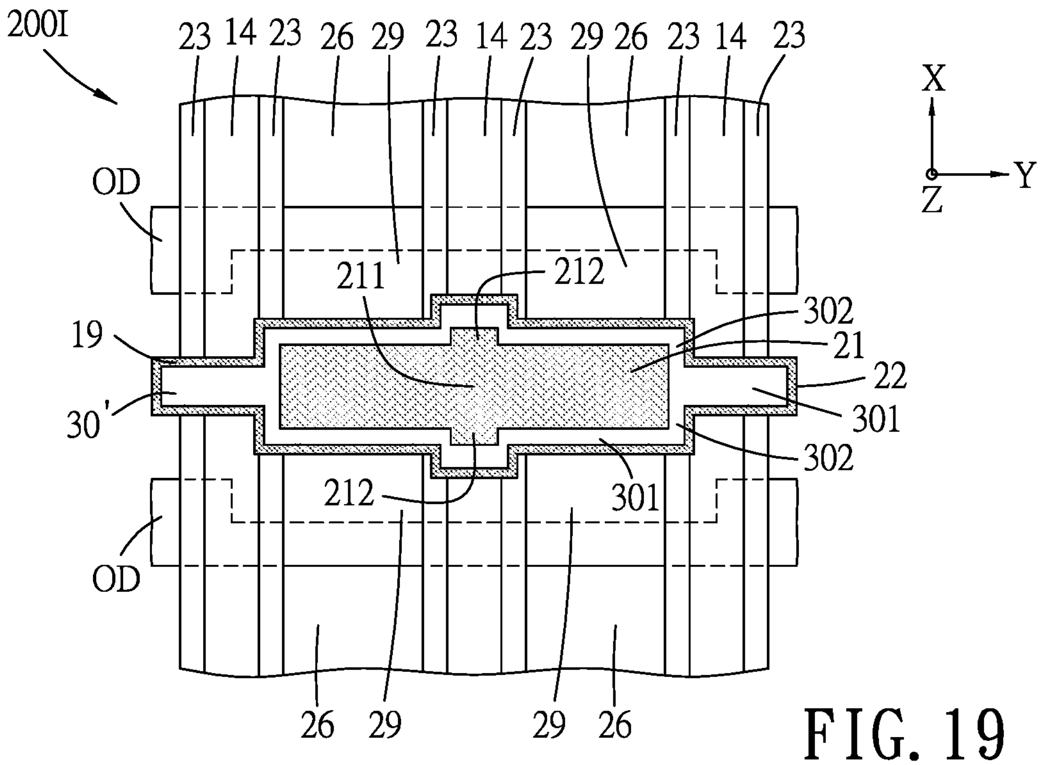

Referring to FIG. 19, the configuration of the isolation structure 22 in the semiconductor device 200I is similar to that of the isolation structure 22 in the semiconductor device 200E. The second dielectric layer 21 of the isolation structure 22 in the semiconductor device 200I has a maximum dimension in the X direction which is smaller than that (in the X direction) of the second dielectric layer 21 of the isolation structure 22 in the semiconductor device 200E.

Figure 20:
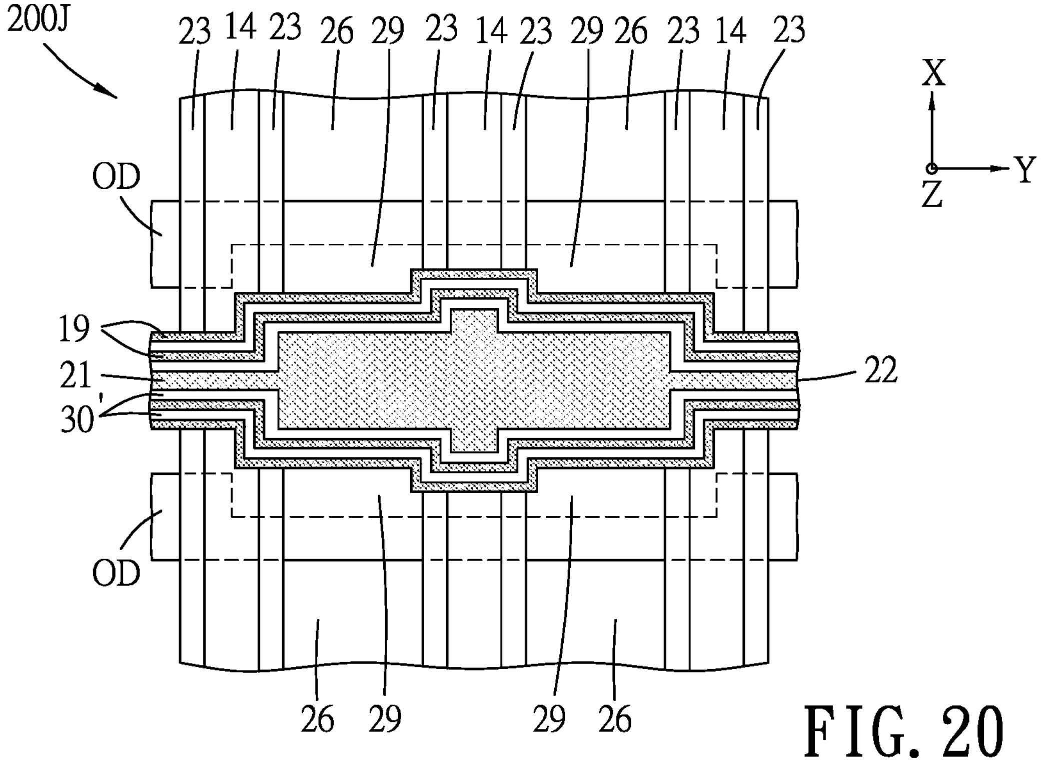

FIG. 20 illustrates a schematic view of a semiconductor device 200J in accordance with some embodiments. In the isolation structure 22 of the semiconductor device 200J, two or more of the first dielectric layers 19 are formed in a manner such that the two or more of the first dielectric layers 19 are spaced apart from each other, and the innermost one of the first dielectric layers 19 is spaced apart from the second dielectric layer 21 so as to form two or more of the air gaps 30'. Two adjacent ones of the first dielectric layers 19 are spaced apart from each other by a corresponding one of the air gaps 30', and the innermost one of the first dielectric layers 19 is spaced apart from the second dielectric layer 21 by a corresponding one of the air gaps 30'. Two of the first dielectric layers 19 and two of the air gaps 30' are shown in FIG. 20.

Similarly, in the isolation structure 22 of each of the semiconductor devices 200A to 200H as described above, two or more of the first dielectric layers 19 may be formed in a manner such that the two or more of the first dielectric layers 19 are spaced apart from each other and the innermost one of the first dielectric layers 19 is spaced apart from the second dielectric layer 21 (if present) so as to form two or more of the air gaps 30'. Two adjacent ones of the first dielectric layers 19 are spaced apart from each other by a corresponding one of the air gaps 30', and the innermost one of the first dielectric layers 19 is spaced apart from the second dielectric layer 21 (if present) by a corresponding one of the air gaps 30'.

In this disclosure, in a semiconductor device, by forming an air gap in an isolation structure disposed between a metal portion and a conductive feature, the capacitor structure formed between the metal portion and the conductive feature may have a reduced capacitance due to smaller dielectric constant of the isolation structure (including a first dielectric layer with a dielectric constant of about 4.4, and an air gap with a dielectric constant of about 1), which is conducive to lowering RC time delay of the semiconductor device. Therefore, the semiconductor device may have an improved device performance.

In accordance with some embodiments of the present disclosure, a semiconductor device includes a semiconductor substrate, a plurality of metal portions, a plurality of nanosheet structures, and a plurality of isolation structures. The metal portions are disposed on the semiconductor substrate and are spaced apart from each other. The nanosheet structures are surrounded by the metal portions such that the nanosheet structures are spaced apart from each other. The isolation structures are disposed on the semiconductor substrate such that two adjacent ones of the metal portions are isolated from each other by a corresponding one of the isolation structures. Each of the isolation structures includes a first dielectric layer and an air gap surrounded by the first dielectric layer.

In accordance with some embodiments of the present disclosure, the isolation structure further includes a second dielectric layer spaced apart from the first dielectric layer by the air gap.

In accordance with some embodiments of the present disclosure, the isolation structure further includes a dummy layer disposed below the air gap and between the first dielectric layer and the second dielectric layer.

In accordance with some embodiments of the present disclosure, the first dielectric layer has a thickness ranging from about 1 nm to about 3 nm.

In accordance with some embodiments of the present disclosure, the air gap has a width ranging from about 1 nm to about 6 nm.

In accordance with some embodiments of the present disclosure, a semiconductor device includes a semiconductor substrate, a plurality of nanosheet structures, a plurality of metal portions, and a plurality of isolation structures. The semiconductor substrate includes a lower portion and a plurality of upper portions disposed on the lower portion and spaced apart from each other in an X direction. The nanosheet structures are respectively disposed on the upper portions of the semiconductor substrate in a Z direction transverse to the X direction. The metal portions surround the nanosheet structures, respectively. The isolation structures are disposed on the semiconductor substrate and extend in the Z direction such that two adjacent ones of the metal portions are isolated from each other by a corresponding one of the isolation structures. Each of the isolation structures includes a first dielectric layer and an air gap surrounded by the first dielectric layer.

In accordance with some embodiments of the present disclosure, each of the isolation structures further includes a second dielectric layer spaced apart from the first dielectric layer by the air gap.

In accordance with some embodiments of the present disclosure, the second dielectric layer has a dimension in the X direction ranging from about 10 nm to about 30 nm.

In accordance with some embodiments of the present disclosure, the second dielectric layer extends in a Y direction transverse to the X direction and the Z direction.

In accordance with some embodiments of the present disclosure, the second dielectric layer includes a main portion and a plurality of jog portions. The main portion extends in the Y direction. The jog portions in each pair of the jog portions extend from the main portion oppositely in the X direction.

In accordance with some embodiments of the present disclosure, the air gap includes a plurality of first air gap portions extending in the Y direction and a plurality of second air gap portions extending in the X direction and being in spatial communication with the first air gap portions.

In accordance with some embodiments of the present disclosure, each of the jog portions in each pair of the jog portions includes a first jog part extending from the main portion in the X direction, and a second jog part extending from the first jog part and away from the main portion in the X direction.

In accordance with some embodiments of the present disclosure, the second dielectric layer includes a plurality of dielectric portions spaced apart from each other in a Y direction transverse to the X direction and the Z direction.

In accordance with some embodiments of the present disclosure, the isolation structure includes a plurality of the first dielectric layers and a plurality of the air gaps. Two adjacent ones of the first dielectric layers are spaced apart from each other by a corresponding one of the air gaps. The innermost one of the first dielectric layers is spaced apart from the second dielectric layer by a corresponding one of the air gaps.

In accordance with some embodiments of the present disclosure, a method for manufacturing a semiconductor device includes: forming a plurality of nanosheet structures on a semiconductor substrate; forming a metal layer on the semiconductor substrate to surround the nanosheet structures such that the nanosheet structures are spaced apart from each other; forming a trench that penetrates the metal layer and that is located between two adjacent ones of the nanosheet structures; conformally forming a first dielectric layer on a surface of the trench; and forming an air gap in the trench such that the air gap is surrounded by the first dielectric layer.

In accordance with some embodiments of the present disclosure, the method for manufacturing a semiconductor device further includes: after formation of the first dielectric layer and before formation of the air gap, forming a dummy layer in the trench such that the dummy layer is surrounded by the first dielectric layer.

In accordance with some embodiments of the present disclosure, the air gap is formed by removing at least an upper portion of the dummy layer.

In accordance with some embodiments of the present disclosure, the method for manufacturing a semiconductor device further includes: after formation of the dummy layer and before formation of the air gap, forming a second dielectric layer in the trench such that the second dielectric layer is surrounded by the dummy layer.

In accordance with some embodiments of the present disclosure, the method for manufacturing a semiconductor device further includes: after formation of the air gap, forming a contact etch stop layer on the metal layer so as to seal the air gap, the contact etch stop layer being made of a dielectric material or germanium.

In accordance with some embodiments of the present disclosure, the contact etch stop layer is formed by chemical vapor deposition or implantation.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a semiconductor substrate;

an isolation portion disposed on the semiconductor substrate;

a plurality of metal portions disposed on the semiconductor substrate and spaced apart from each other;

a plurality of nanosheet structures surrounded by the plurality of metal portions such that the plurality of nanosheet structures are spaced apart from each other; and a plurality of isolation structures disposed on the semiconductor substrate such that two adjacent ones of the plurality of metal portions are isolated from each other by a corresponding one of the plurality of isolation structures, one of the plurality of isolation structures including a first dielectric layer and an air gap surrounded by the first dielectric layer, wherein the one of the plurality of isolation structures further includes a second dielectric layer spaced apart from the first dielectric layer by the air gap, and a bottommost end of the second dielectric layer is located above a top surface of the isolation portion.

2. The semiconductor device as claimed in claim 1, wherein the one of the plurality of isolation structures further includes a dummy layer disposed below the air gap and between the first dielectric layer and the second dielectric layer.

3. The semiconductor device as claimed in claim 1, wherein the first dielectric layer has a thickness ranging from 1 nm to 3 nm.

4. The semiconductor device as claimed in claim 1, wherein the air gap has a width ranging from 1 nm to 6 nm.

5. A semiconductor device, comprising:

a semiconductor substrate including a lower portion and a plurality of upper portions disposed on the lower portion and spaced apart from each other in a first direction;

a plurality of nanosheet structures respectively disposed on the plurality of upper portions of the semiconductor substrate in a second direction transverse to the first direction;

a plurality of metal portions surrounding the plurality of nanosheet structures, respectively; and a plurality of isolation structures disposed on the semiconductor substrate and extending in the second direction such that two adjacent ones of the plurality of metal portions are isolated from each other by a corresponding one of the plurality of isolation structures, one of the plurality of isolation structures including a first dielectric layer and an air gap surrounded by the first dielectric layer, wherein a bottommost end of the air gap of the one of the plurality of isolation structures is located above an upper surface of a corresponding one of the plurality of upper portions.

6. The semiconductor device as claimed in claim 5, wherein the one of the plurality of isolation structures further includes a second dielectric layer spaced apart from the first dielectric layer by the air gap.

7. The semiconductor device as claimed in claim 6, wherein the second dielectric layer has a dimension in the first direction ranging from 10 nm to 30 nm.

8. The semiconductor device as claimed in claim 6, wherein the second dielectric layer extends in a third direction transverse to the first direction and the second direction.

9. The semiconductor device as claimed in claim 8, wherein the second dielectric layer includes a main portion and a plurality of jog portions, the main portion extending in the third direction, the plurality of jog portions in each pair of the jog portions extending from the main portion oppositely in the first direction.

10. The semiconductor device as claimed in claim 9, wherein the air gap includes a plurality of first air gap portions extending in the third direction and a plurality of second air gap portions extending in the first direction and being in spatial communication with the plurality of first air gap portions.

11. The semiconductor device as claimed in claim 9, wherein one of the plurality of jog portions in each pair of the plurality of jog portions includes a first jog part extending from the main portion in the first direction, and a second jog part extending from the first jog part and away from the main portion in the first direction.

12. The semiconductor device as claimed in claim 6, wherein the second dielectric layer includes a plurality of dielectric portions spaced apart from each other in a third direction transverse to the first direction and the second direction.

13. The semiconductor device as claimed in claim 10, wherein one of the isolation structures includes a plurality of the first dielectric layers and a plurality of the air gaps, two adjacent ones of the plurality of first dielectric layers being spaced apart from each other by a corresponding one of the plurality of air gaps, the innermost one of the plurality of first dielectric layers being spaced apart from the second dielectric layer by a corresponding one of the plurality of air gaps.

14. A method for manufacturing a semiconductor device, comprising:

forming a plurality of nanosheet structures on a plurality of upper portions of a semiconductor substrate, the plurality of upper portions of the semiconductor substrate being disposed on a lower portion of the semiconductor substrate and being spaced apart from each other;

forming a metal layer on the semiconductor substrate to surround the plurality of nanosheet structures such that the plurality of nanosheet structures are spaced apart from each other;

forming a trench that penetrates the metal layer and that is located between two adjacent ones of the plurality of nanosheet structures;

conformally forming a first dielectric layer on a surface of the trench; and forming an air gap in the trench such that the air gap is surrounded by the first dielectric layer, wherein the method further comprises:

after formation of the first dielectric layer and before formation of the air gap, forming a dummy layer in the trench such that the dummy layer is surrounded by the first dielectric layer, and etching the dummy layer so as to form the air gap, and wherein a topmost end of the dummy layer after being etched is located above a top surface of one of the plurality of upper portions.

15. The method as claimed in claim 14, wherein the air gap is formed by removing at least an upper portion of the dummy layer.

16. The method as claimed in claim 14, further comprising, after formation of the dummy layer and before formation of the air gap, forming a second dielectric layer in the trench such that the second dielectric layer is surrounded by the dummy layer.

17. The method as claimed in claim 14, further comprising, after formation of the air gap, forming a contact etch stop layer on the metal layer so as to seal the air gap, the contact etch stop layer being made of a dielectric material or germanium.

18. The method as claimed in claim 17, wherein the contact etch stop layer is formed by chemical vapor deposition or implantation.

19. The method as claimed in claim 14, wherein a thickness of the dummy layer after being etched increases in a direction from the topmost end of the dummy layer after being etched to a bottommost end of the dummy layer after being etched.

20. The method as claimed in claim 14, wherein the dummy layer after being etched has an inner surface and an outer surface which are distal from and proximate to the first dielectric layer, respectively, a distance between a topmost point of the inner surface and an upper surface of the lower portion being different from a distance between a topmost end of the outer surface and the upper surface of the lower portion in a vertical direction normal to the semiconductor substrate.

* * * * *